(12) United States Patent
Kim et al.

(10) Patent No.: US 11,501,827 B2
(45) Date of Patent: Nov. 15, 2022

(54) VERTICAL MEMORY DEVICE WITH A DOUBLE WORD LINE STRUCTURE

(71) Applicant: SK hynix Inc., Gyeonggi-do (KR)

(72) Inventors: Seung-Hwan Kim, Seoul (KR);
Su-Ock Chung, Seoul (KR);
Seon-Yong Cha, Chungcheongbuk-do (KR)

(73) Assignee: SK hynix Inc., Gyeonggi-do (KR)

( * ) Notice: Subject to any disclaimer, the term of this patent is extended or adjusted under 35 U.S.C. 154(b) by 368 days.

(21) Appl. No.: 16/728,174

(22) Filed: Dec. 27, 2019

(65) Prior Publication Data
US 2020/0279601 A1    Sep. 3, 2020

(30) Foreign Application Priority Data

Feb. 28, 2019   (KR) .......................... 10-2019-0024083

(51) Int. Cl.
| | | |
|---|---|---|
| G11C 11/4097 | (2006.01) | |
| H01L 27/108 | (2006.01) | |
| G11C 7/18 | (2006.01) | |
| G11C 11/401 | (2006.01) | |

(52) U.S. Cl.
CPC ............ *G11C 11/4097* (2013.01); *G11C 7/18* (2013.01); *G11C 11/401* (2013.01); *H01L 27/10805* (2013.01)

(58) Field of Classification Search
CPC ...... G11C 11/4097; G11C 7/18; G11C 11/401; G11C 5/025; G11C 8/14; H01L 27/10805; H01L 27/10885; H01L 27/1085; H01L 27/10873; H01L 23/50; H01L 27/10897
See application file for complete search history.

(56) References Cited

U.S. PATENT DOCUMENTS

| | | | |
|---|---|---|---|
| 7,649,763 B2 | 1/2010 | Takashima | |
| 8,232,587 B2* | 7/2012 | Tu | ...................... H01L 27/10852 257/308 |
| 9,514,792 B2 | 12/2016 | Kajigaya | |
| 2018/0323199 A1 | 11/2018 | Roberts et al. | |
| 2020/0083225 A1* | 3/2020 | Ma | ........................ G11C 11/401 |

* cited by examiner

*Primary Examiner* — Jerome Leboeuf
(74) *Attorney, Agent, or Firm* — IP & T Group LLP

(57) ABSTRACT

A memory device includes: a substrate; a bit line which is vertically oriented from the substrate; a plate line which is vertically oriented from the substrate; and a memory cell provided with a transistor and a capacitor that are positioned in a lateral arrangement between the bit line and the plate line, wherein the transistor includes: an active layer which is laterally oriented to be parallel to the substrate between the bit line and the capacitor; and a line-shaped lower word line and a line-shaped upper word line vertically stacked with the active layer therebetween and oriented to intersect with the active layer.

20 Claims, 15 Drawing Sheets

VERTICAL MEMORY DEVICE WITH A DOUBLE WORD LINE STRUCTURE

CROSS-REFERENCE TO RELATED APPLICATIONS

The present application claims priority of Korean Patent Application No. 10-2019-0024083, filed on Feb. 28, 2019, which is incorporated herein by reference in its entirety.

BACKGROUND

1. Field

Various embodiments of the present invention relate generally to a semiconductor device and, more particularly, to a memory device.

2. Description of the Related Art

Recently, the size of memory cells continues to be decreased in order to increase the net die of a memory device.

As the size of the memory cell is miniaturized, a parasitic capacitance has to be decreased while capacitance is increased. However, it is difficult to increase the net die due to structural limitations of the memory cells.

SUMMARY

Embodiments of the present invention are directed to highly integrated vertical memory cell arrays, and a memory device including the highly integrated vertical memory cell arrays.

The memory device may exhibit increased memory cell density. The memory device may exhibit reduced parasitic capacitance.

In accordance with an embodiment of the present invention, a memory device includes: a substrate; a bit line which is vertically oriented from the substrate; a plate line which is vertically oriented from the substrate; and a memory cell provided with a transistor and a capacitor that are positioned in a lateral arrangement between the bit line and the plate line, wherein the transistor includes: an active layer which is laterally oriented to be parallel to the substrate between the bit line and the capacitor; and a line-shaped lower word line and a line-shaped upper word line vertically stacked with the active layer therebetween and oriented to intersect with the active layer.

In accordance with another embodiment of the present invention, a memory device includes: a substrate; a bit line which is vertically oriented from the substrate; a plate line which is vertically oriented from the substrate; and a plurality of memory cells that are stacked in a direction perpendicular to the substrate between the bit line and the plate line, wherein each of the memory cells includes: a transistor provided with an active layer which is laterally oriented to be parallel to the substrate between the bit line and the plate line, and a pair of line-shaped word lines which are vertically stacked with the active layer therebetween and extending to intersect with the active layer; and a capacitor provided with a cylindrical first node which is laterally oriented to be parallel to the substrate between the transistor and the plate line, a second node, and a dielectric material between the cylindrical first node and the second node.

DETAILED DESCRIPTION

Figure 1:
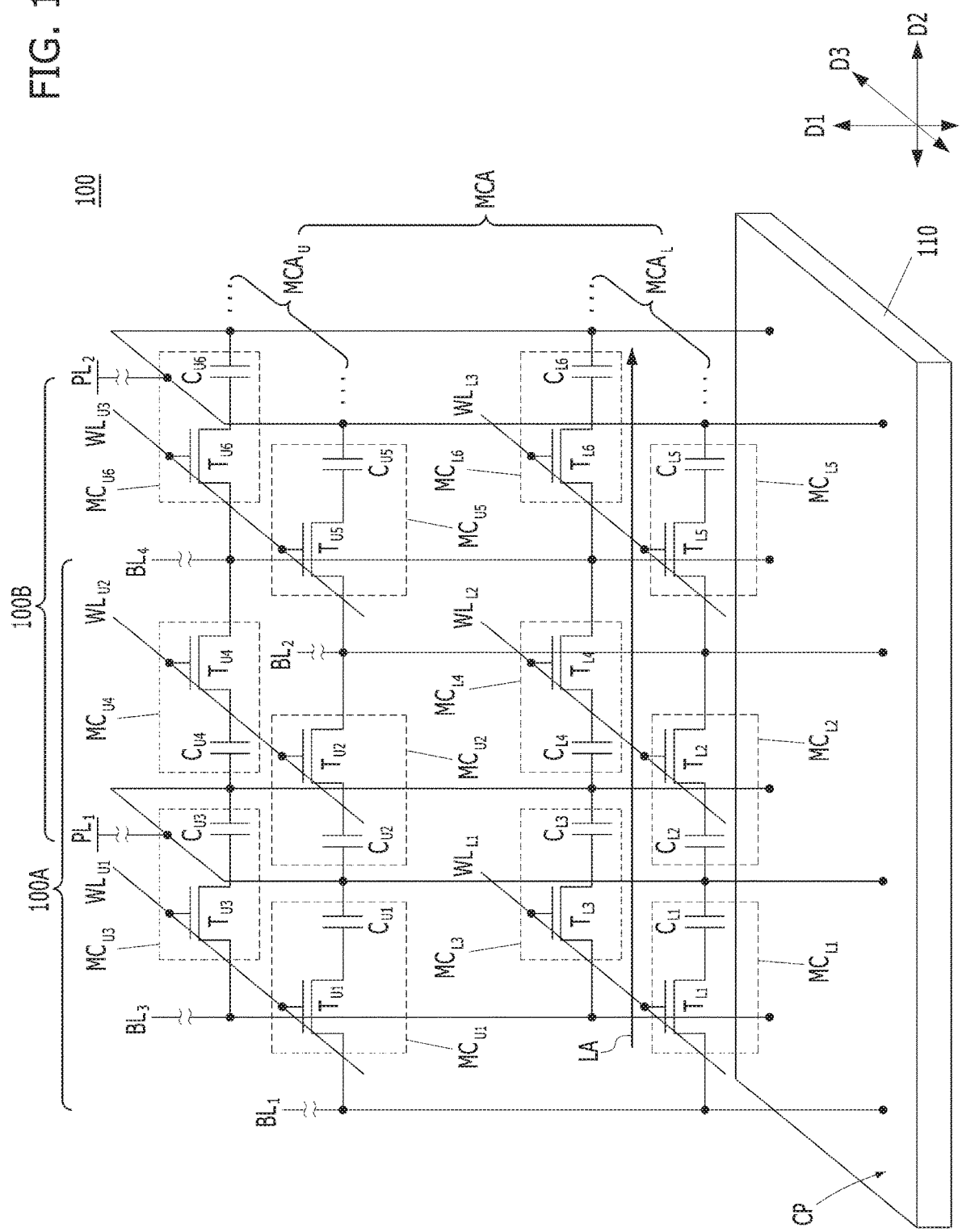
FIG. 1 is an equivalent circuit diagram illustrating a memory device according to an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

The drawings are not necessarily to scale and, in some instances, proportions may have been exaggerated in order to clearly illustrate features of the embodiments. When a first layer is referred to as being "on" a second layer or "on" a substrate, it not only refers to a case where the first layer is formed directly on the second layer or the substrate but also to a case where a third layer exists between the first layer and the second layer or the substrate.

According to the following embodiments of the present invention, memory cell density may be increased and parasitic capacitance may be reduced by vertically stacking memory cells.

Figure 2:
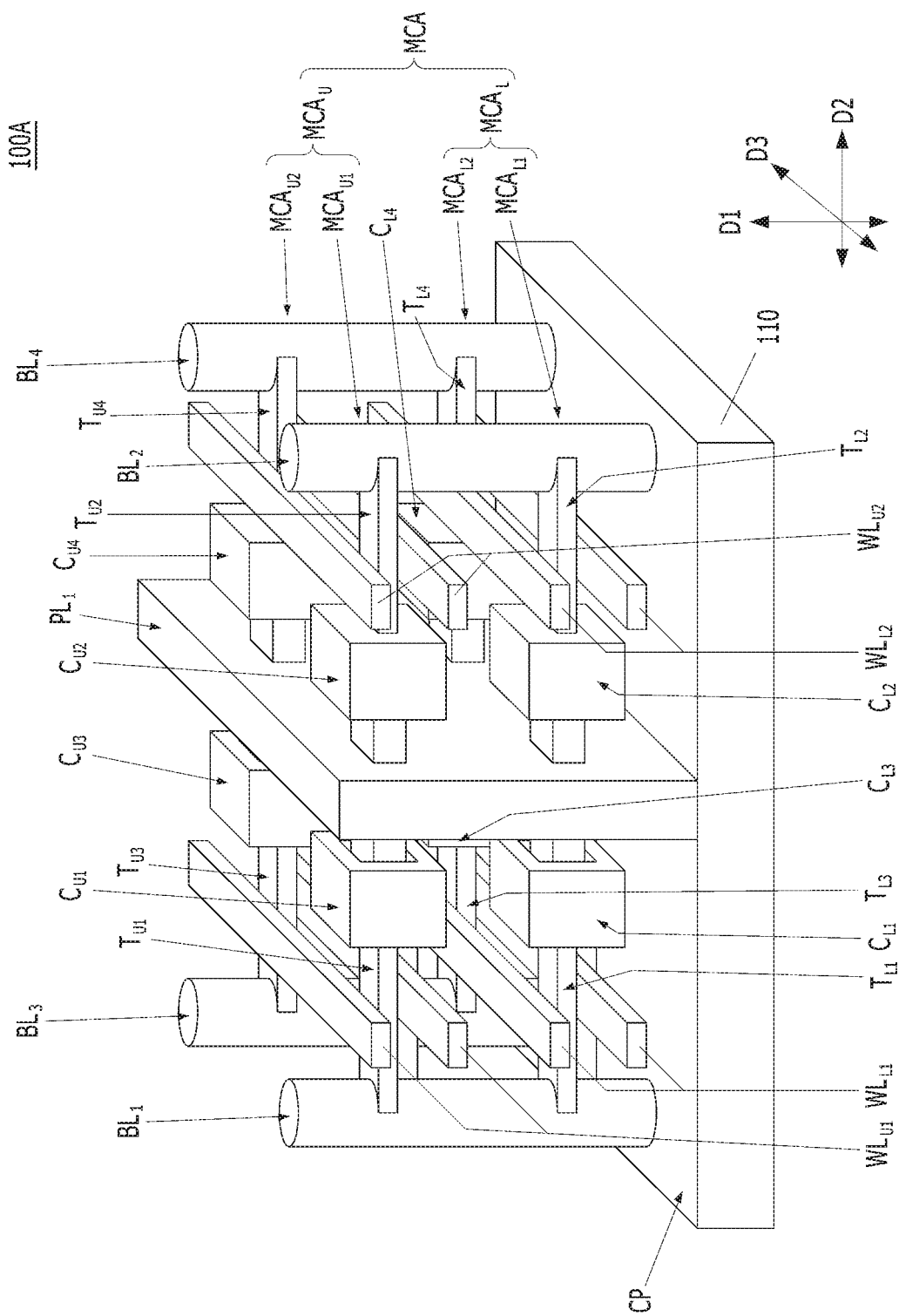
FIG. 2 is a perspective view illustrating a mirror-like structure sharing a plate line of FIG. 1.
Figure 3:
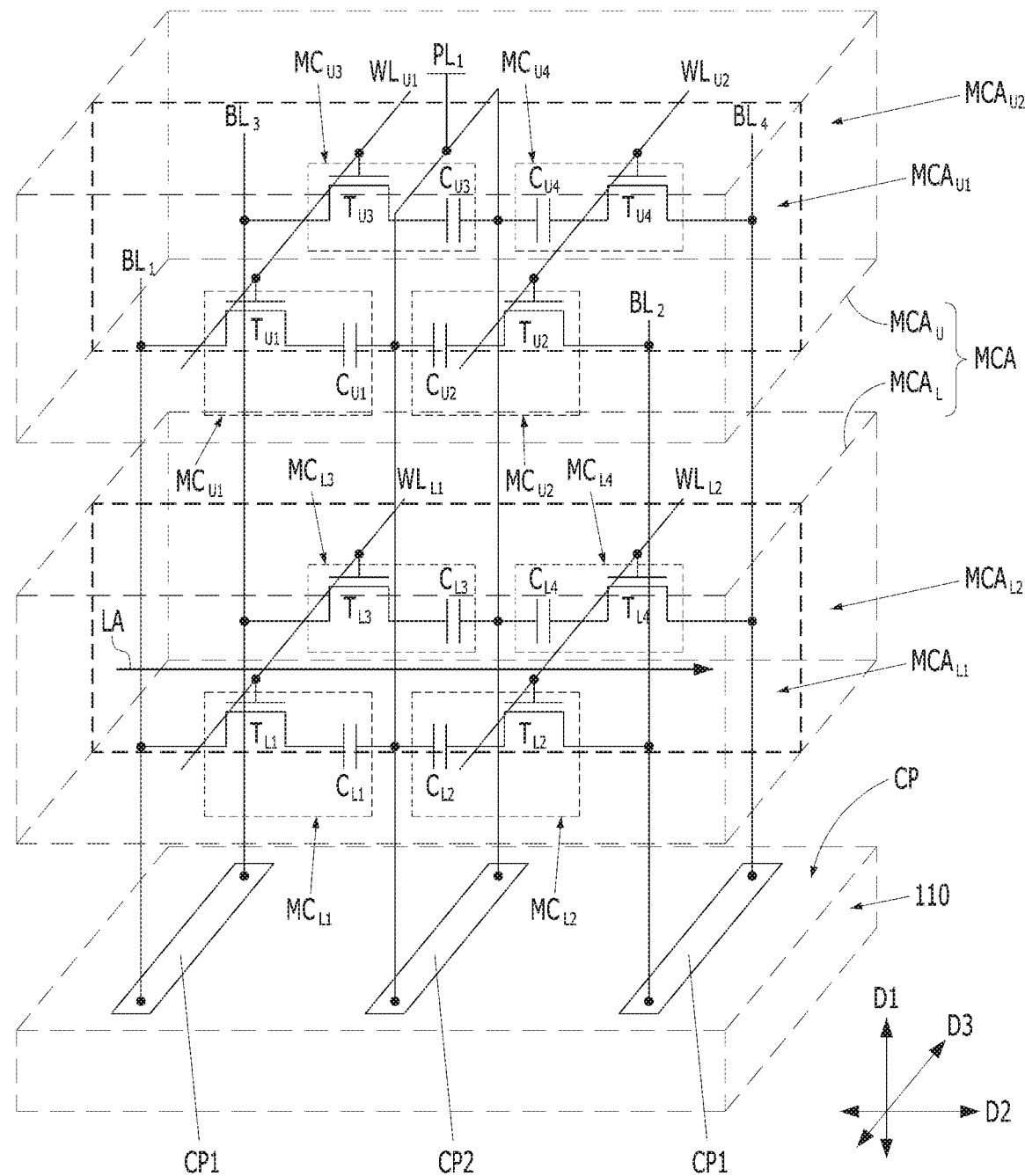
FIG. 3 is an equivalent circuit diagram illustrating the mirror-like structure shown in FIG. 2.
Figure 4:
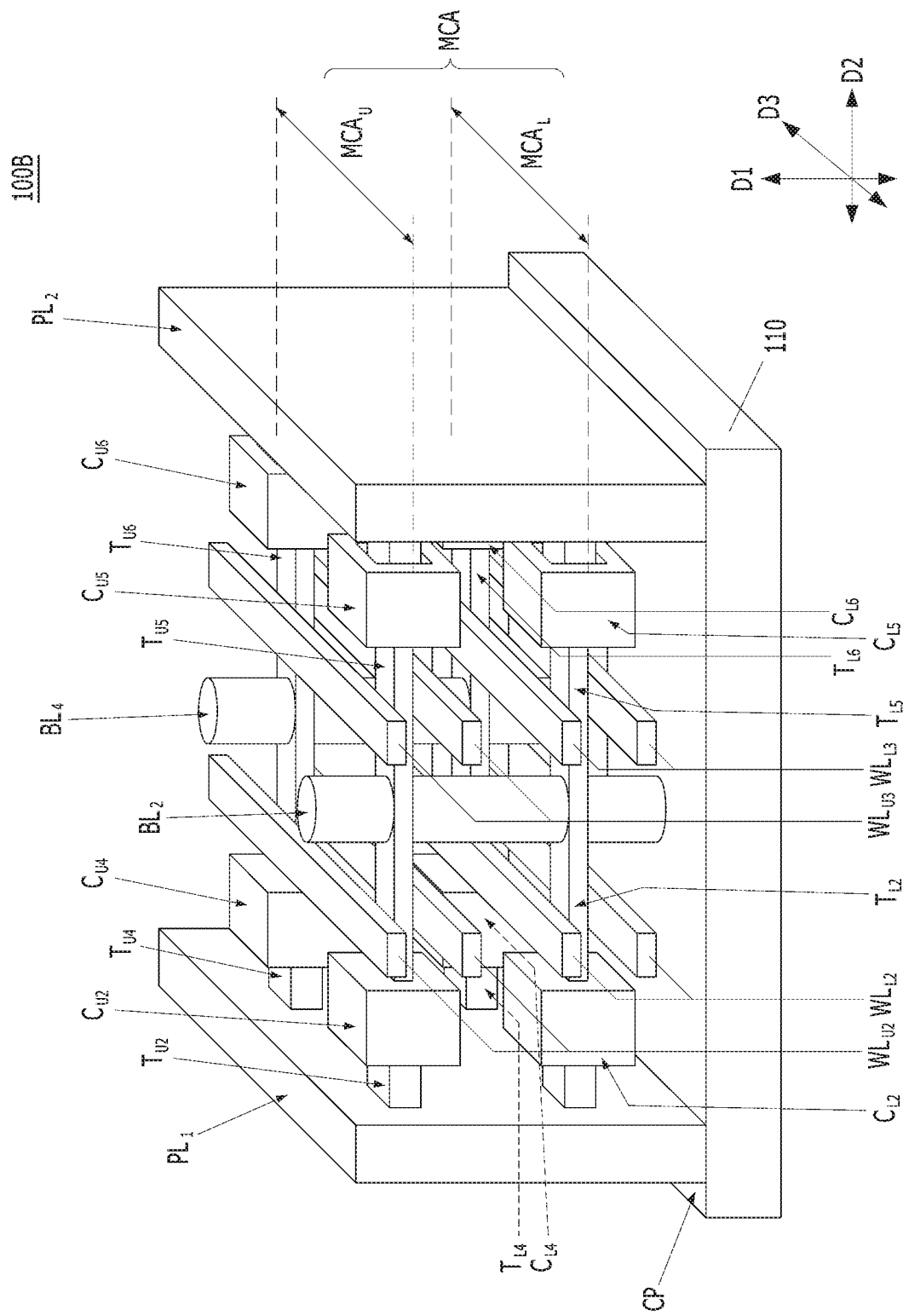
FIG. 4 is a perspective view illustrating a mirror-like structure sharing a bit line shown in FIG. 1.
Figure 5:
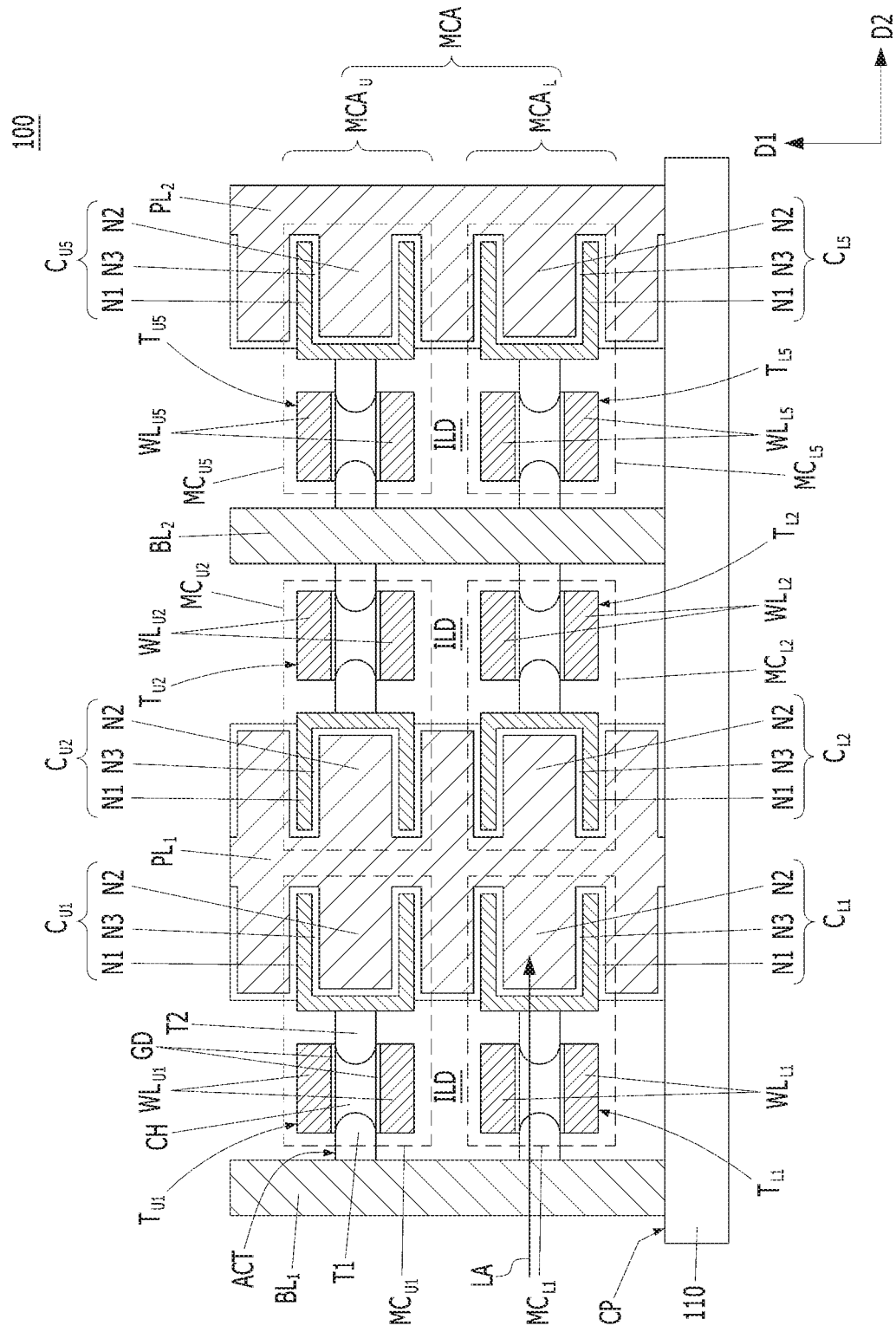
FIG. 5 is a cross-sectional view illustrating the memory device shown in FIG. 1.
Figure 6:
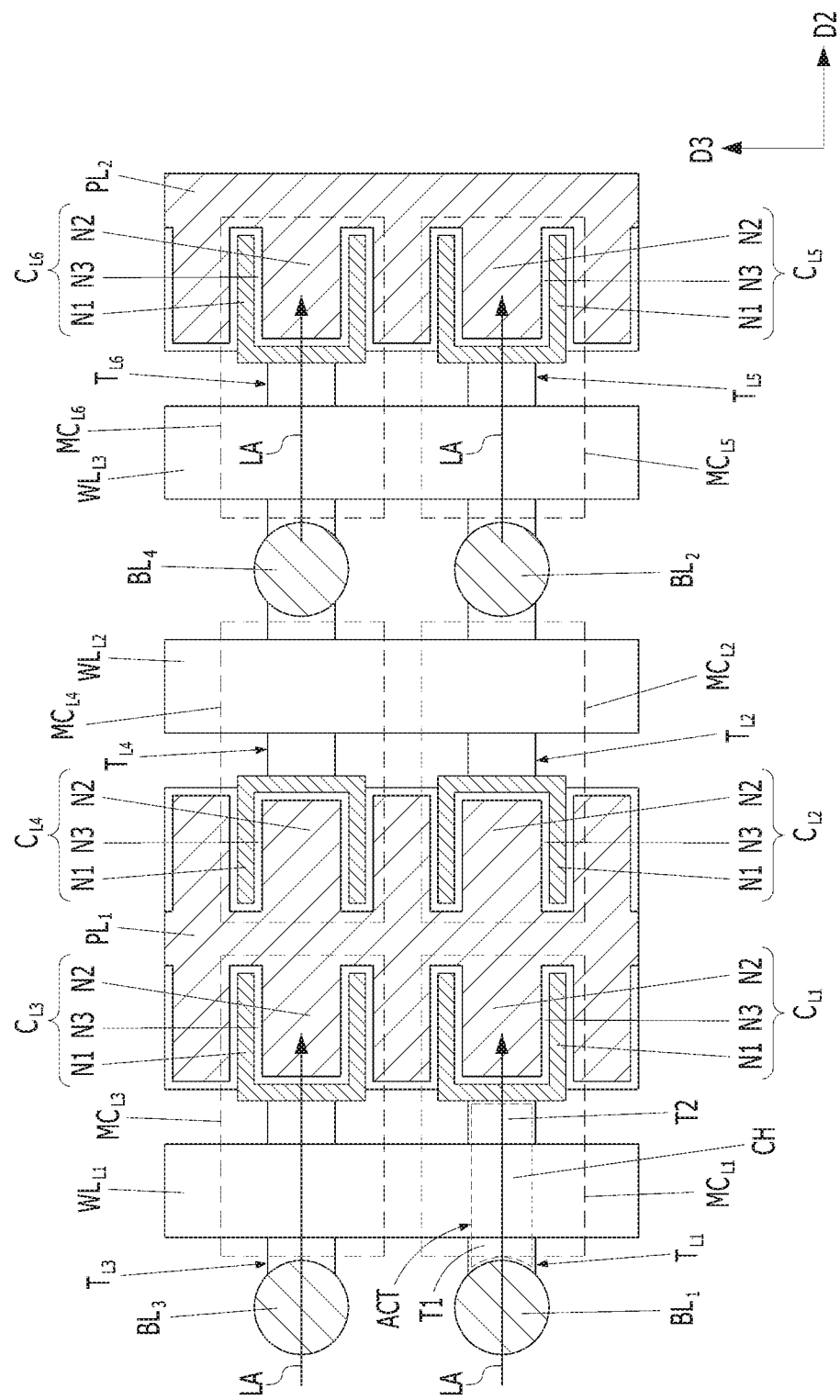
FIG. 6 is a plan view illustrating the memory device shown in FIG. 1.

FIG. 1 is an equivalent circuit diagram illustrating a memory device according to an embodiment of the present invention. FIG. 2 is a perspective view illustrating a mirror-like structure 100A sharing a plate line of FIG. 1. FIG. 3 is an equivalent circuit diagram illustrating the mirror-like structure shown in FIG. 2. FIG. 4 is a perspective view illustrating a mirror-like structure 100B sharing a bit line shown in FIG. 1. FIG. 5 is a cross-sectional view illustrating the memory device shown in FIG. 1. FIG. 6 is a plan view illustrating the memory device shown in FIG. 1.

The memory device 100 may include a peripheral structure 110 and a memory cell array stack MCA. The memory cell array stack MCA may be positioned over the peripheral structure 110. The memory cell array stack MCA may include a plurality of memory cell arrays $MCA_L$ and $MCA_U$. The positioning of the memory cell array MCA relatively to the peripheral structure 110 may vary according to various implementations of the present invention. For example, according to another embodiment of the present invention, the memory cell array stack MCA may be positioned under the peripheral structure 110. The memory cell array stack MCA may include DRAM memory cell array.

The memory cell array stack MCA may include at least two memory cell arrays $MCA_L$ and $MCA_U$ stacked over the peripheral structure 110. The at least two memory cell arrays $MCA_L$ and $MCA_U$ may be vertically stacked over the peripheral structure 110. Generally, an n number of memory cell arrays may be stacked in the memory cell array, where n is an integer equal to or greater than 2. According to an embodiment, the at least two memory cell arrays $MCA_L$ and $MCA_U$ may form one pair of memory cell arrays and the memory cell array stack MCA may include a plurality of pairs of memory cell arrays stacked over the peripheral structure 110. The plurality of pairs of memory cell arrays may be stacked vertically over the peripheral structure 110. In another embodiment, a plurality of pairs of memory cell arrays may be laterally arranged over the peripheral structure 110, each pair being identical to the pair of the at least two memory cell arrays $MCA_L$ and $MCA_U$.

The peripheral structure 110 may include a material suitable for semiconductor processing including, for example, a semiconductor material. For example, the peripheral structure 110 may include a substrate made of a semiconductor material, such as a silicon substrate, a monocrystalline silicon substrate, a polysilicon substrate, an amorphous silicon substrate, a silicon germanium substrate, a monocrystalline silicon germanium substrate, a polycrystalline silicon germanium substrate, a carbon-doped silicon substrate, or a combination thereof. The peripheral structure 110 may include a single-layer semiconductor substrate. The peripheral structure 110 may include a multi-layer semiconductor substrate. The peripheral structure 110 may include other semiconductor materials such as germanium. The peripheral structure 110 may include a III/V-group semiconductor substrate, for example, a compound semiconductor substrate such as GaAs. The peripheral structure 110 may include an SOI (Silicon-On-Insulator) substrate. The peripheral structure 110 may have a stacked structure of a semiconductor substrate and a dielectric material.

The surface of the peripheral structure 110 may include a surface of the substrate. For example, the surface of the peripheral structure 110 may include a plane CP. The memory cell array stack MCA may be positioned vertically over the plane CP of the peripheral structure 110. The memory cell array stack MCA may be formed in a first direction D1 perpendicular to the surface, i.e., the plane CP, of the peripheral structure 110. The first direction D1 may be a direction perpendicular to the plane CP, and the second direction D2 and the third direction D3 may be directions parallel to the plane CP. The second direction D2 and the third direction D3 may intersect with each other, and the first direction D1 may intersect with the second direction D2 and the third direction D3. The two memory cell arrays $MCA_L$ and $MCA_U$ may be grouped as one pair and a plurality of the pairs may be vertically stacked over the peripheral structure 110 in the first direction D1.

The plane CP of the peripheral structure 110 may include a first plane CP1 and a second plane CP2. The first plane CP1 and the second plane CP2 may be spaced apart from each other in a second direction D2 which is perpendicular to the first direction D1. The first plane CP1 and the second plane CP2 may be surfaces of the same material. The first plane CP1 and the second plane CP2 may be surfaces of different materials. The first plane CP1 and the second plane CP2 may be electrically insulated. The plane CP may be provided by a dielectric material. The top surface of the peripheral structure 110 may provide the plane CP. The top surface of the peripheral structure 110 may be of a substrate. The top surface of the peripheral structure 110 may be of a dielectric material or a conductive material. The first plane CP1 and the second plane CP2 may be of a dielectric material or a conductive material. The first plane CP1 may be of a conductive material and the second plane CP2 may be of a dielectric material.

The peripheral structure 110 may include at least one peripheral circuit portion for controlling the memory cell array stack MCA. The at least one peripheral circuit portion is formed under the memory cell array stack MCA. The at least one peripheral circuit portion may include at least one circuit selected from sense amplifiers and sub-word line drivers.

The two memory cell arrays $MCA_L$ and $MCA_U$ may be arranged over the plane CP of the peripheral structure 110. For the sake of convenience in description, the two memory cell arrays $MCA_L$ and $MCA_U$ may be respectively called a lower memory cell array $MCA_L$ and an upper memory cell array $MCA_U$. A plurality of pairs each of which includes the two memory cell arrays $MCA_L$ and $MCA_U$ may be laterally arranged in a third direction D3 over the peripheral structure 110. For example, referring to FIGS. 2 and 3, the lower memory cell arrays $MCA_{L1}$ and $MCA_{L2}$ may be laterally arranged along the third direction D3, and the upper memory cell arrays $MCA_{U1}$ and $MCA_{U2}$ may be laterally arranged along the third direction D3.

The memory cell array stack MCA may include a plurality of word lines $WL_{L1}$, $WL_{L2}$, $WL_{L3}$, $WL_{U1}$, $WL_{U2}$, and $WL_{U3}$, a plurality of bit lines $BL_1$, $BL_2$, $BL_3$ and $BL_4$, a plurality of memory cells $MC_{L1}$, $MC_{L2}$ and $MC_{L3}$, $MC_{L4}$, $MC_{L5}$, $MC_{L6}$, $MC_{U1}$, $MC_{U2}$, $MC_{U3}$, $MC_{U4}$, $MC_{U5}$ and $MC_{U6}$, and a plurality of plate lines $PL_1$ and $PL_2$. The number of word lines, the number of bit lines, the number of memory cells, and the number of plate lines are not limited and may vary according to various implementations of the present invention.

The lower memory cell array $MCA_L$ may include a plurality of word lines $WL_{L1}$, $WL_{L2}$ and $WL_{L3}$, a plurality of bit lines $BL_1$, $BL_2$, $BL_3$ and $BL_4$, a plurality of memory cells $MC_{L1}$, $MC_{L2}$, $MC_{L3}$, $MC_{L4}$, $MC_{L5}$ and $MC_{L6}$, and a plurality of plate lines $PL_1$ and $PL_2$. The upper memory cell array $MCA_U$ may include a plurality of word lines $WL_{U1}$, $WL_{U2}$ and $WL_{U3}$, a plurality of bit lines $BL_1$, $BL_2$, $BL_3$ and $BL_4$, a plurality of memory cells $MC_{U1}$, $MC_{U2}$, $MC_{U3}$, $MC_{U4}$, $MC_{L5}$ and $MC_{L6}$, and a plurality of plate lines $PL_1$ and $PL_2$.

The bit lines $BL_1$, $BL_2$, $BL_3$ and $BL_4$ may extend along the first vertical direction D1 from the plane CP of the peripheral structure 110. For example, the bit lines $BL_1$, $BL_2$, $BL_3$ and $BL_4$ may extend along the first vertical direction D1 from the substrate. The bit lines $BL_1$, $BL_2$, $BL_3$ and $BL_4$ may each be in direct contact with the plane CP of the peripheral structure 110. The bit lines $BL_1$, $BL_2$, $BL_3$ and $BL_4$ may be vertically oriented from a plane CP. The bit lines $BL_1$, $BL_2$, $BL_3$ and $BL_4$ may be referred to as vertically oriented bit lines VBL. The bit lines $BL_2$, $BL_3$ and $BL_4$ may be parallel to each other while spaced apart from each other. The bit lines $BL_1$, $BL_2$, $BL_3$ and $BL_4$ may be independently arranged laterally while spaced apart from each other in the second direction D2 and the third direction D3. The bit lines $BL_1$ and $BL_2$ may be arranged independently along the second direction D2. The bit lines $BL_1$ and $BL_3$ may be independently arranged along the third direction D3. The bit lines $BL_2$ and $BL_4$ may be independently arranged along the third direction D3.

Memory cell $MC_{L1}$ may be coupled to bit line $BL_1$. Memory cell $MC_{U1}$ may be coupled to bit line $BL_1$. Memory cells $MC_{L1}$ and $MC_{U1}$ may be arranged vertically along the first direction D1 and may be coupled to bit line $BL_1$. The lower memory cell array $MCA_L$ and the upper memory cell array $MCA_U$ may share bit line $BL_1$. Memory cells $MC_{L1}$ and $MC_{U1}$ may be stacked vertically from the plane CP between the bit line $BL_1$ and the plate line $PL_1$. Bit line $BL_3$ may be positioned laterally away from the bit line $BL_1$ along the third direction D3. The bit line $BL_3$ may be vertically oriented from the plane CR Memory cells $MC_{L3}$ and $MC_{U3}$ may be stacked vertically from the plane CP between the bit line $BL_3$ and the plate line $PL_1$. The memory cells $MC_{L1}$ and $MC_{U1}$ may each be commonly coupled with the plate line $PL_1$ and the bit line $BL_1$. The memory cells $MC_{L3}$ and $MC_{U3}$ may each be commonly coupled with the plate line $PL_1$ and the bit line $BL_3$.

Referring now to the bit line $BL_2$, memory cell $MC_{L2}$ may be coupled to the bit line $BL_2$. Memory cell $MC_{U2}$ may be coupled to the bit line $BL_2$. Memory cells $MC_{L2}$ and $MC_{U2}$ may be arranged vertically in the first direction D1 and may be coupled to bit line $BL_2$. The lower memory cell array $MCA_L$ and the upper memory cell array $MCA_U$ may share bit line $BL_2$. Bit line $BL_4$ may be positioned laterally away from the bit line $BL_2$ along the third direction D3. The bit line $BL_4$ may be vertically oriented from the plane CP. Memory cells $MC_{L4}$ and $MC_{U4}$ may be stacked vertically from the plane CP between the bit line $BL_4$ and the plate line $PL_1$. Memory cells $MC_{L2}$ and $MC_{U2}$ may be stacked vertically from the plane CP between the bit line $BL_2$ and the plate line $PL_1$. The memory cells $MC_{L2}$ and $MC_{U2}$ may each be commonly coupled with plate line $PL_1$ and the bit line $BL_2$. The memory cells $MC_{L4}$ and $MC_{U4}$ may each be commonly coupled with plate line $PL_1$ and the bit line $BL_4$.

Memory cell $MC_{L3}$ may be coupled to the bit line $BL_3$. Memory cell $MC_{U3}$ may be coupled to the bit line $BL_3$. Memory cells $MC_{L3}$ and $MC_{U3}$ arranged vertically in the first direction D1 may be coupled to the bit line $BL_3$. The lower memory cell array $MCA_L$ and the upper memory cell array $MCA_U$ may share the bit line $BL_3$.

Memory cell $MC_{L4}$ may be coupled to bit line $BL_4$. Memory cell $MC_{U4}$ may be coupled to bit line $BL_4$. Memory cells $MC_{L4}$ and $MC_{U4}$ arranged vertically in the first direction D1 may be coupled to the bit line $BL_4$. The lower memory cell array $MCA_L$ and the upper memory cell array $MCA_U$ may share the bit line $BL_4$.

As described above, the lower memory cell array $MCA_L$ may include the bit lines $BL_1$, $BL_2$, $BL_3$ and $BL_4$. The upper memory cell array $MCA_U$ may include the bit lines $BL_1$, $BL_2$, $BL_3$ and $BL_4$. The lower memory cell array $MCA_L$ and the upper memory cell array $MCA_U$ may each be commonly coupled with each of the bit lines $BL_1$, $BL_2$, $BL_3$ and $BL_4$.

The word lines $WL_{L1}$, $WL_{L2}$, $WL_{U1}$, $WL_{U2}$, $WL_{L3}$ and $WL_{U3}$ may be parallel to the surface of the peripheral structure 110 and may each extend in the third direction D3 which intersects with the first direction D1. The word lines $WL_{L1}$, $WL_{L2}$, $WL_{U1}$, $WL_{U2}$, $WL_{L3}$ and $WL_{U3}$ may be referred to as lateral word lines. The word lines $WL_{L1}$, $WL_{L2}$, $WL_{U1}$, $WL_{U2}$, $WL_{L3}$ and $WL_{U3}$ may be arranged in a direction intersecting with the bit lines $BL_1$, $BL_2$, $BL_3$ and $BL_4$. The word lines $WL_{L1}$, $WL_{L2}$ and $WL_{L3}$ may be positioned at a first level in the first direction D1. The word lines $WL_{L1}$, $WL_{L2}$ and $WL_{L3}$ may be positioned in the lower memory cell array $MCA_L$. The word lines $WL_{L1}$, $WL_{L2}$ and $WL_{L3}$ may be arranged at a regular interval along the second direction D2 and may each extend in the third direction D3. The word lines $WL_{U1}$, $WL_{U2}$ and $WL_{U3}$ may be positioned at a second level in the first direction D1. The word lines $WL_{U1}$, $WL_{U2}$ and $WL_{U3}$ may be positioned in the upper memory cell array $MCA_U$. The word lines $WL_{U1}$, $WL_{U2}$ and $WL_{U3}$ may be arranged at a regular interval along the second direction D2 and may each extend in the third direction D3. The second level may be further away from the peripheral structure 110 than the first level.

Referring now to the word line $WL_{L1}$, memory cell $MC_{L1}$ may be coupled to the word line $WL_{L1}$. Memory cell $MC_{L3}$ may be coupled to the word line $WL_{L1}$. Memory cells $MC_{L1}$ and $MC_{L3}$ may be laterally arranged while spaced apart from each other along the third direction D3 may be coupled to the word line $WL_{L1}$. It is noted that reference to a word line being connected with a memory cell means that the gate of the word line is coupled with the word line.

Memory cell $MC_{L2}$ may be coupled to the word line $WL_{L2}$. Memory cell $MC_{L4}$ may be coupled to the word line $WL_{L2}$. Memory cells $MC_{L2}$ and $MC_{L4}$ may be laterally arranged while spaced apart from each other along the third direction D3 and may be coupled to the word line $WL_{L2}$.

Memory cell $MC_{L5}$ may be coupled to the word line $WL_{L3}$. Memory cell $MC_{L6}$ may be coupled to the word line $WL_{L3}$. Memory cells $MC_{L5}$ and $MC_{L6}$ may be laterally arranged while spaced apart from each other along the third direction D3 and may be coupled to the word line $WL_{L3}$.

Memory cell $MC_{U1}$ may be coupled to the word line $WL_{U1}$. Memory cell $MC_{U3}$ may be coupled to the word line $WL_{U1}$. Memory cells $MC_{U1}$ and $MC_{U3}$ may be laterally arranged while spaced apart from each other along the third direction D3 and may be coupled to the word line $WL_{U1}$.

Memory cell $MC_{U2}$ may be coupled to the word line $WL_{U2}$. Memory cell $MC_{U4}$ may be coupled to the word line $WL_{U2}$. Memory cells $MC_{U2}$ and $MC_{U4}$ may be laterally arranged while spaced apart from each other along the third direction D3 and may be coupled to the word line $WL_{U2}$.

Memory cell $MC_{U5}$ may be coupled to the word line $WL_{U3}$. Memory cell $MC_{U6}$ may be coupled to the word line $WL_{U3}$. Memory cells $MC_{U5}$ and $MC_{U6}$ may be laterally arranged while spaced apart from each other along the third direction D3 and may be coupled to the word line $WL_{U3}$.

As described above, the lower memory cell array $MCA_L$ may include the word lines $WL_{L1}$, $WL_{L2}$ and $WL_{L3}$ that are parallel to each other while spaced apart from each other in the second direction D2, and the upper memory cell array $MCA_U$ may include the word lines $WL_{U1}$, $WL_{U2}$ and $WL_{U3}$ that are parallel to each other while spaced apart from each other in the second direction D2.

Referring to FIG. 3, in an embodiment second plane CP2 may be disposed between left and right first planes CP1. The word line $WL_{L1}$ of the lower memory cell array $MCA_L$ and the word line $WL_{U1}$ of the upper memory cell array $MCA_U$ may be spaced apart from each other and arranged vertically from the left first plane CP1 in the first direction D1. The word line $WL_{L2}$ of the lower memory cell array $MCA_L$ and the word line $WL_{U2}$ of the upper memory cell array $MCA_U$ may be spaced apart from each other and arranged vertically from the second plane CP2 in the first direction D1. The word line $WL_{L3}$ of the lower memory cell array $MCA_L$ and the word line $WL_{U3}$ of the upper memory cell array $MCA_U$ may be spaced apart from each other and arranged vertically from the right first plane CP1 in the first direction D1.

The lower memory cell array $MCA_L$ and the upper memory cell array $MCA_U$ may each share plate line $PL_1$ and $PL_2$. (See FIG. 1) The plate lines $PL_1$ and $PL_2$ may each be oriented vertically from the plane CP of the peripheral structure 110 in the first direction D1. The plate lines $PL_1$ and $PL_2$ may be in direct contact with the plane CP of the peripheral structure 110 as illustrated in FIG. 1. However, according to a variation of the described embodiment, the plate lines $PL_1$ and $PL_2$ may not contact the plane CP of the peripheral structure 110. The plate lines $PL_1$ and $PL_2$ may intersect with the word lines $WL_{L1}$, $WL_{L2}$, $WL_{L3}$, $WL_{U1}$, $WL_{U2}$ and $WL_{U3}$ and may be parallel to the bit lines $BL_1$, $BL_2$, $BL_3$ and $BL_4$. The plate lines $PL_1$ and $PL_2$ may be set to a fixed potential (for example, a ground potential). According to the embodiment of the present invention, the plate lines $PL_1$ and $PL_2$ may be oriented in the first direction D1 vertically from the plane CP of the peripheral structure 110, and may be elongated in the direction D3 intersecting with the first direction D1. The plate lines $PL_1$ and $PL_2$ may be vertically oriented from the plane CP. For example, the plate lines $PL_2$ and $PL_2$ may extend along the first vertical direction D1 from the substrate. The plate lines $PL_1$ and $PL_2$ may be referred to as vertical plate lines VPL. The plate lines $PL_1$ and $PL_2$ may be linear-shaped pillars extending laterally along the third direction D3 while vertically oriented in the first direction D1.

The bit lines $BL_1$, $BL_2$, $BL_3$ and $BL_4$ and the plate lines $PL_2$ and $PL_2$ may be spaced apart from each other over the plane CP. More specifically, the plate line $PL_1$ may be positioned between the bit lines $BL_1$ and $BL_2$ along the second direction D2. Referring to FIG. 3, the bit lines $BL_1$, $BL_2$, $BL_3$ and $BL_4$ may be coupled to the first plane CP1, and the plate lines $PL_1$ and $PL_2$ may be coupled to the second plane CP2. More specifically, bit lines $BL_1$, and $BL_3$ may be coupled to the left first plane CP1, the bit lines $BL_2$, and $BL_4$ may be coupled to the right first plane CP1, the plate line $PL_1$ may be coupled to the second plane CP2 which is shown disposed between the left and right planes CP1 and CP2, and the plate line $PL_2$ may be coupled to another second plane CP2 not shown in FIG. 3. The bit lines $BL_1$, $BL_2$, $BL_3$ and $BL_4$ and the plate lines $PL_1$ and $PL_2$ may be electrically insulated.

Each of the memory cells $MC_{L1}$, $MC_{L3}$, $MC_{U1}$, and $MC_{U3}$ may be positioned between a plane defined by the bit lines $BL_1$ and $BL_3$ and a plane defined by the plate line $PL_1$. Each of the memory cells $MC_{L2}$, $MC_{L4}$, $MC_{U2}$, and $MC_{U4}$ may be positioned between a plane defined by the bit lines $BL_2$ and $BL_4$ and a plane defined by the plate line $PL_2$. The memory cells $MC_{L1}$, $MC_{L2}$, and $MC_{L5}$, may be positioned in a lateral arrangement (LA) in the second direction D2. The memory cells $MC_{U1}$, $MC_{U2}$, and $MC_{U5}$ may be positioned in a lateral arrangement (LA) in the second direction D2. The memory cells $MC_{L3}$, $MC_{L4}$, and $MC_{L6}$, may be positioned in a lateral arrangement (LA) in the second direction D2 and the memory cells $MC_{U3}$, $MC_{U4}$, and $MC_{U6}$, may be positioned in a lateral arrangement (LA) in the second direction D2. The memory cells $MC_{L1}$, $MC_{L2}$, $MC_{L3}$, $MC_{L4}$, $MC_{L5}$, $MC_{L6}$, $MC_{U1}$, $MC_{U2}$, $MC_{U3}$, $MC_{U4}$, $MC_{U5}$, and $MC_{U6}$ may be positioned above the peripheral structure 110 which is spaced apart from the plane CP in four levels along the first direction D1, with each level having two rows spaced apart along the third direction D3, each row extending in the second direction D2.

Memory cell $MC_{L1}$ may be coupled to the plate line $PL_1$. Memory cells $MC_{L1}$ and $MC_{U1}$ that are arranged vertically in the first direction D1 may be coupled to the plate line $PL_1$. Memory cells $MC_{L1}$ and $MC_{L2}$ may be laterally arranged while spaced apart from each other in the second direction D2 and may be coupled to the plate line $PL_1$. Memory cells $MC_{L1}$ and $MC_{L3}$ may be laterally arranged while spaced apart from each other along the third direction D3 and may be coupled to the plate line $PL_1$.

The memory cells $MC_{L1}$, $MC_{L2}$, $MC_{L3}$, $MC_{L4}$, $MC_{U1}$, $MC_{U2}$, $MC_{U3}$ and $MC_{U4}$ may include transistors $T_{L1}$, $T_{L2}$, $T_{L3}$, $T_{L4}$, $T_{U1}$, $T_{U2}$, $T_{U3}$ and $T_{U4}$ and capacitors $C_{L1}$, $C_{L2}$, $C_{L3}$, $C_{L4}$, $C_{U1}$, $C_{U2}$, $C_{U3}$ and $C_{U4}$, respectively. The transistors $T_{L1}$, $T_{L3}$, $T_{U1}$, and $T_{U3}$ and their respective capacitors $C_{L1}$, $C_{L3}$, $C_{U1}$, and $C_{U3}$ may be positioned between the plane defined by the bit lines $BL_1$, and $BL_3$ and the plane of the plate line $PL_1$. The transistors $T_{L2}$, $T_{L4}$, $T_{U2}$, and $T_{U4}$ and their respective capacitors $C_{L2}$, $C_{L4}$, $C_{U2}$, and $C_{U4}$ may be positioned between the plane defined by the bit lines $BL_2$, and $BL_4$ and the plane of plate line $PL_2$ in the second direction D2. Each of the transistors $T_{L1}$, $T_{L2}$, $T_{L3}$, $T_{L4}$, $T_{U1}$, $T_{U2}$, $T_{U3}$ and $T_{U4}$ may be positioned in a lateral arrangement (LA) extending in the second direction D2 with its respective capacitor among the capacitors $C_{L1}$, $C_{L2}$, $C_{L3}$, $C_{L4}$, $C_{U1}$, $C_{U2}$, $C_{U3}$ and $C_{U4}$. Each of the capacitors $C_{L1}$, $C_{L2}$, $C_{L3}$, $C_{U1}$, $C_{U2}$, $C_{U3}$ and $C_{U4}$ may be positioned between its respective transistor among the transistors $T_{L1}$, $T_{L2}$, $T_{L3}$, $T_{L4}$, $T_{U1}$, $T_{U2}$, $T_{U3}$ and $T_{U4}$ and the plate line $PL_1$.

Referring to FIGS. 1, 2 and 3, a mirror-like structure 100A sharing a plate line is described.

The memory cell $MC_{L1}$ may include the transistor $T_{L1}$ and the capacitor $C_{L1}$. One end of the transistor $T_{L1}$ may be coupled to the bit line $BL_1$ and the other end of the transistor $T_{L1}$ may be coupled to one end of the capacitor $C_{L1}$. The other end of the capacitor $C_{L1}$ may be coupled to the plate line $PL_1$. The memory cell $MC_{L2}$ may include the transistor $T_{L2}$ and the capacitor $C_{L2}$. One end of the transistor $T_{L2}$ may be coupled to the bit line $BL_2$ and the other end of the transistor $T_{L2}$ may be coupled to one end of the capacitor $C_{L2}$. The other end of the capacitor $C_{L2}$ may be coupled to the plate line $PL_1$. As described above, the memory cells $MC_{L1}$ and $MC_{L2}$ may be symmetrically disposed with reference to the plate line $PL_1$.

That is, the memory cells $MC_{L1}$ and $MC_{L2}$ may be arranged in a mirror-like structure sharing the plate line $PL_1$ while being coupled to different bit lines $BL_1$ and $BL_2$. The memory cells $MC_{L1}$ and $MC_{L2}$ may be laterally arranged in the second direction D2 which is parallel to the plane CP.

Likewise, the memory cells $MC_{L3}$ and $MC_{L4}$ may be arranged in a mirror-like structure sharing the plate line $PL_1$ while being coupled to different bit lines $BL_3$ and $BL_4$. The memory cells $MC_{L3}$ and $MC_{L4}$ may be laterally arranged in the second direction D2 which is parallel to the plane CP.

The memory cells $MC_{U1}$ and $MC_{U2}$ may be arranged in a mirror-like structure sharing the plate line $PL_1$ while being coupled to different bit lines $BL_1$ and $BL_2$. The memory cells $MC_{U1}$ and $MC_{U2}$ may be laterally arranged in the second direction D2 which is parallel to the plane CP.

The memory cells $MC_{U3}$ and $MC_{U4}$ may be arranged in a mirror-like structure sharing the plate line $PL_1$ while being coupled to different bit lines $BL_3$ and $BL_4$. The memory cells $MC_{U3}$ and $MC_{U4}$ may be laterally arranged in the second direction D2 which is parallel to the plane CP.

Referring to FIGS. 1 and 4, a mirror-like structure 100B sharing a bit line is described.

The memory cell $MC_{L2}$ may include the transistor $T_{L2}$ and the capacitor $C_{L2}$. One end of the transistor $T_{L2}$ may be coupled to the bit line $BL_2$ and the other end of the transistor $T_{L2}$ may be coupled to one end of the capacitor $C_{L2}$. The other end of the capacitor $C_{L2}$ may be coupled to the plate line $PL_1$. The memory cell $MC_{L5}$ may include the transistor $T_{L5}$ and the capacitor $C_{L5}$. One end of the transistor $T_{L5}$ may be coupled to the bit line $BL_2$ and the other end of the transistor $T_{L5}$ may be coupled to one end of the capacitor $C_{L5}$. The other end of the capacitor $C_{L5}$ may be coupled to the plate line $PL_2$. As described above, the memory cells $MC_{L2}$ and $MC_{L5}$ are symmetrically disposed with reference to the bit line $BL_2$.

That is, the memory cells $MC_{L2}$ and $MC_{L5}$ may be arranged in a mirror-like structure sharing the bit line $BL_2$ while being coupled to different plate lines $PL_1$ and $PL_2$. The memory cells $MC_{L2}$ and $MC_{L5}$ may be laterally arranged in the second direction D2 which is parallel to the plane CP.

The memory cells $MC_{L4}$ and $MC_{L6}$ may be arranged in a mirror-like structure sharing the bit line $BL_4$ while being coupled to different plate lines $PL_2$ and $PL_2$. The memory cells $MC_{L4}$ and $MC_{L6}$ may be laterally arranged in the second direction D2 which is parallel to the plane CP.

The memory cells $MC_{U2}$ and $MC_{U5}$ may be arranged in a mirror-like structure sharing the bit line $BL_2$ while being coupled to different plate lines $PL_1$ and $PL_2$. The memory cells $MC_{U2}$ and $MC_{U5}$ may be laterally arranged in the second direction D2 which is parallel to the plane CP.

The memory cells $MC_{U4}$ and $MC_{U6}$ may be arranged in a mirror-like structure sharing the bit line $BL_4$ while being coupled to different plate lines $PL_1$ and $PL_2$. The memory cells $MC_{U4}$ and $MC_{U6}$ may be laterally arranged in the second direction D2 which is parallel to the plane CR.

The memory device 100 shown in FIG. 1 may include both of the mirror-like structure 100A sharing a plate line and the mirror-like structure 100B sharing a bit line.

FIG. 5 is a cross-sectional view illustrating a portion of the memory device 100 of FIG. 1, illustrating memory cells coupled to the bit lines $BL_1$ and $BL_2$ and the plate lines $PL_1$ and $PL_2$.

Referring to FIGS. 1 to 5, the memory device 100 may include a memory cell array stack MCA which is positioned above the peripheral structure 110, and the memory cell array stack MCA may include a lower memory cell array $MCA_S$ and an upper memory cell array $MCA_U$ that are vertically stacked. The memory device 100 may include bit lines $BL_1$ and $BL_2$ and plate lines $PL_1$ and $PL_2$ that are spaced apart from each other and vertically oriented relatively to the peripheral structure 110.

The memory cells $MC_{L1}$ and $MC_{U1}$ including transistors $T_{L1}$ and $T_{U1}$ and capacitors $C_{L1}$ and $C_{U1}$, respectively, may be formed between the bit line $BL_1$ and the plate line $PL_1$. Also, the memory cells $MC_{L2}$ and $MC_{U2}$ including transistors $T_{L2}$ and $T_{U2}$ and capacitors $C_{L2}$ and $C_{U2}$ respectively. The memory cells $MC_{L5}$ and $MC_{U5}$ including transistors $T_{L5}$ and $T_{U5}$ and capacitors $C_{L5}$ and $C_{U5}$ respectively, may be formed between the bit line $BL_2$ and the plate line $PL_2$. The memory cells $MC_{L1}$, $MC_{L2}$, and $MC_{L5}$ may be positioned at the same level in relation to the first direction D1 and in a lateral arrangement spaced apart from each other along the second direction D2. The memory cells $MC_{U1}$, $MC_{U2}$, and $MC_{U5}$ may be positioned at the same level in relation to the first direction D1 and in a lateral arrangement spaced apart from each other along the second direction D2. The transistor and capacitor forming each memory cell may be arranged laterally to each other along the second direction D2.

Each of the transistors $T_{L1}$, $T_{L2}$, $T_{L5}$, $T_{U1}$, $T_{U2}$ and $T_{U5}$ may include an active layer ACT which is laterally oriented with respect to the peripheral structure 110, and the active layer ACT may include a first source/drain region T1, a channel CH, and a second source/drain region T2. The first source/drain region T1, the channel CH, and the second source/drain region T2 may be positioned in a lateral arrangement along the second direction D2 which is parallel to the peripheral structure 110. The transistors $T_{L1}$, $T_{L2}$, $T_{L5}$, $T_{U1}$, $T_{U2}$ and $T_{U5}$ may include word lines $WL_{L1}$, $WL_{L2}$, $WL_{L5}$, $WL_{U1}$, $WL_{U2}$ and $WL_{U5}$, respectively, and the word lines $WL_{L1}$, $WL_{L2}$, $WL_{L5}$, $WL_{U1}$, $WL_{U2}$ and $WL_{U5}$ may be in a line shape extending so as to intersect with the active layer ACT. As illustrated in FIG. 5, the word lines $WL_{L1}$, $WL_{L2}$, $WL_{L5}$, $WL_{U1}$, $WL_{U2}$ and $WL_{U5}$ may be of a double word line structure in which the word lines are vertically stacked with the active layer ACT between them. Each of the word lines $WL_{L1}$, $WL_{L2}$, $WL_{L5}$, $WL_{U1}$, $WL_{U2}$ and $WL_{U5}$ may be composed of two conductive layers with the active layer ACT therebetween. A gate dielectric layer GD may be formed between each of the word lines $WL_{L1}$, $WL_{L2}$, $WL_{L5}$, $WL_{U1}$, $WL_{U2}$ and $WL_{U5}$ and the corresponding active layer ACT.

The capacitors $C_{L1}$, $C_{L2}$, $C_{L5}$, $C_{U1}$, $C_{U2}$ and $C_{U5}$ may each include a first node N1, a second node N2, and a dielectric material N3 between the first node N1 and the second node N2. The first node N1, the dielectric material N3, and the second node N2 may be positioned in a lateral arrangement which is parallel to the peripheral structure 110. According to the cross-sectional view of FIG. 5, each first node N1 may have a square bracket shape facing towards a respective plate line. Specifically, each first node N1 of the capacitors $C_{L1}$, $C_{L2}$, $C_{U1}$, and $C_{U2}$ may have a square bracket shape ("[" or "]" facing towards the plate line $PL_1$ and each first node N1 of the capacitors $C_{L5}$ and $C_{U5}$ may have a square bracket shape facing towards the plate line $PL_2$. Stated otherwise the first node N1 may have a cylinder shape with on end of the cylinder being open. The horizontal parts of the bracket shape extending in the second direction D2 of each of the first nodes N1 may be longer than the part extending in the first direction D1 as illustrated in FIG. 5. The dielectric material N3 may be formed conformally within the interior surface of each first node N1 to leave a central region within each first node N1 to be filled with the second node N2. The second node N2 may extend from the respective plate line $PL_1$ or $PL_2$ to fill the inside of the central region of the first node N1. The dielectric material N3 may be disposed between each pair of first and second nodes N1 and N2.

Dielectric materials ILD may be formed between the lower memory cells $MC_{L1}$, $MC_{L2}$ and $MC_{L5}$ and the upper memory cells $MC_{U1}$, $MC_{U2}$ and $MC_{U5}$ that are vertically stacked. Thus, in the memory cell array stack MCA, the dielectric materials ILD may be positioned between the lower memory cell array $MCA_L$ and the upper memory cell array $MCA_U$. When a plurality of memory cell arrays are stacked, the lower memory cell arrays $MCA_L$, the dielectric materials ILD, and the upper memory cell arrays $MCA_U$ may be alternately stacked vertically.

FIG. 6 is a plan view illustrating the lower memory cell array $MCA_L$ of the memory cell array stack MCA.

Referring to FIGS. 1 to 6, the lower memory cell array $MCA_L$ may include bit lines $BL_1$, $BL_2$, $BL_3$ and $BL_4$ and plate lines $PL_1$ and $PL_2$. The bit lines $BL_1$, $BL_2$, $BL_3$ and $BL_4$ and the plate lines $PL_1$ and $PL_2$ may be vertically oriented from the peripheral structure 110, individually. The bit lines $BL_1$, $BL_2$, $BL_3$ and $BL_4$ and the plate lines $PL_1$ and $PL_2$ may be spaced apart from each other.

A memory cell Mai including a transistor $T_{L1}$ and a capacitor $C_{L1}$ that are positioned in a lateral arrangement (LA) between the bit line $BL_1$ and the plate line $PL_1$ may be formed. A memory cell $MC_{L3}$ including a transistor $T_{L3}$ and a capacitor $C_{L3}$ that are positioned in a lateral arrangement (LA) between the bit line $BL_3$ and the plate line $PL_1$ may be formed. A memory cell $MC_{L2}$ including a transistor $T_{L2}$ and a capacitor $C_{L2}$ that are positioned in a lateral arrangement (LA) between the bit line $BL_2$ and the plate line $PL_1$ may be formed. A memory cell $MC_{L4}$ including a transistor $T_{L4}$ and a capacitor $C_{L4}$ that are positioned in a lateral arrangement (LA) between the bit line $BL_4$ and the plate line $PL_1$ may be formed.

A memory cell $MC_{L5}$ including a transistor $T_{L5}$ and a capacitor $C_{L5}$ that are positioned in a lateral arrangement (LA) between the bit line $BL_2$ and the plate line $PL_2$ may be formed. A memory cell $MC_{L6}$ including a transistor $T_{L6}$ and a capacitor $C_{L6}$ that are positioned in a lateral arrangement (LA) between the bit line $BL_4$ and the plate line $PL_2$ may be formed.

Each of the transistors $T_{L1}$, $T_{L2}$, $T_{L3}$, $T_{L4}$, $T_{L5}$ and $T_{L6}$ may include an active layer ACT which is laterally oriented with respect to the peripheral structure 110, and the active layer ACT may include a first source/drain region T1, a channel CH, and a second source/drain region T2. The first source/drain region T1, the channel CH, and the second source/drain region T2 may be positioned in a lateral arrangement LA which is parallel to the peripheral structure 110. The transistors $T_{L1}$ $T_{L2}$, may include the word line $WL_{L1}$, the transistors $T_{L4}$, may include the word line $WL_{L2}$ and the transistors $T_{L5}$ and $T_{L6}$ may include the word line $WL_{L3}$. The word lines $WL_{L1}$, $WL_{L2}$ and $WL_{L3}$ may each have a shape of a line that extends in the third direction D3. The word lines $WL_{L1}$, $WL_{L2}$ and $WL_{L3}$ may each have a shape of a line that extends in the third direction D3 to overlap with the active region ACT of the channel CH of respective transistors. Specifically, the word line $WL_{L1}$, may overlap with the active region ACT of the channel CH of transistors $T_{L1}$ and $T_{L3}$, the word lines $WL_{L2}$, may overlap with the active region ACT of the channel CH of transistors $T_{L2}$ and $T_{L4}$, and the word line $WL_{L3}$, may overlap with the active region ACT of the channel CH of transistors $T_{L5}$ and $T_{L6}$. The word lines $WL_{L1}$, $WL_{L2}$ and $WL_{L3}$ may have a double word line structure in which the word lines $WL_{L1}$, $WL_{L2}$ and $WL_{L3}$ are vertically stacked with the respective active layers ACT between them. The transistors $T_{L1}$ and $T_{L3}$ may each be commonly coupled with word line $WL_{L1}$, the transistors $T_{L2}$ and $T_{L4}$ may each be commonly coupled with word line $WL_{L2}$, and the transistors $T_{L5}$ and $T_{L6}$ may each be commonly coupled with word line $WL_{L3}$.

The capacitors $C_{L1}$, $C_{L2}$, $C_{L3}$, $C_{L4}$, $C_{L5}$ and $C_{L6}$ may each include the first node N1, the second node N2, and the dielectric material N3 between the first node N1 and the second node N2. According to the view of FIG. 6, each first node N1 may have a square bracket shape facing towards a respective plate line. Specifically, each first node N1 of the capacitors $C_{L1}$, $C_{L2}$, $C_{L3}$, and $C_{L4}$ may have a square bracket shape ("[" or "]" facing towards the plate line $PL_1$ and each first node N1 of the capacitors $C_{L5}$ and $C_{L6}$ may have a square bracket shape facing towards the plate line $PL_2$. The horizontal parts of the bracket shape extending in the second direction D2 of each of the first nodes N1 may be longer than the part extending in the third direction D3 as illustrated in FIG. 6. The dielectric material N3 may be formed conformally within the interior surface of each first node N1 to leave a central region within each first node N1 to be filled with the second node N2. The second node N2 may extend from the respective plate line $PL_1$ or $PL_2$ to fill the inside of the central region of the first node N1. The dielectric material N3 may be disposed between each pair of first and second nodes N1 and N2.

Figure 7:
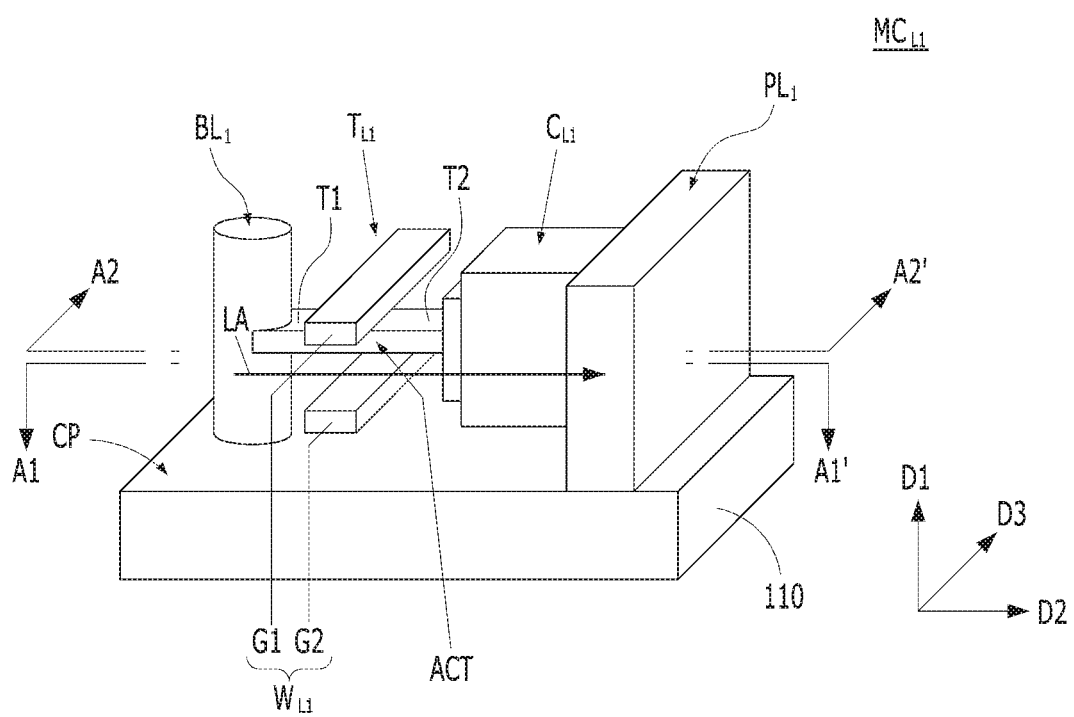
FIG. 7 is a perspective view showing details of a memory cell.
Figure 8:
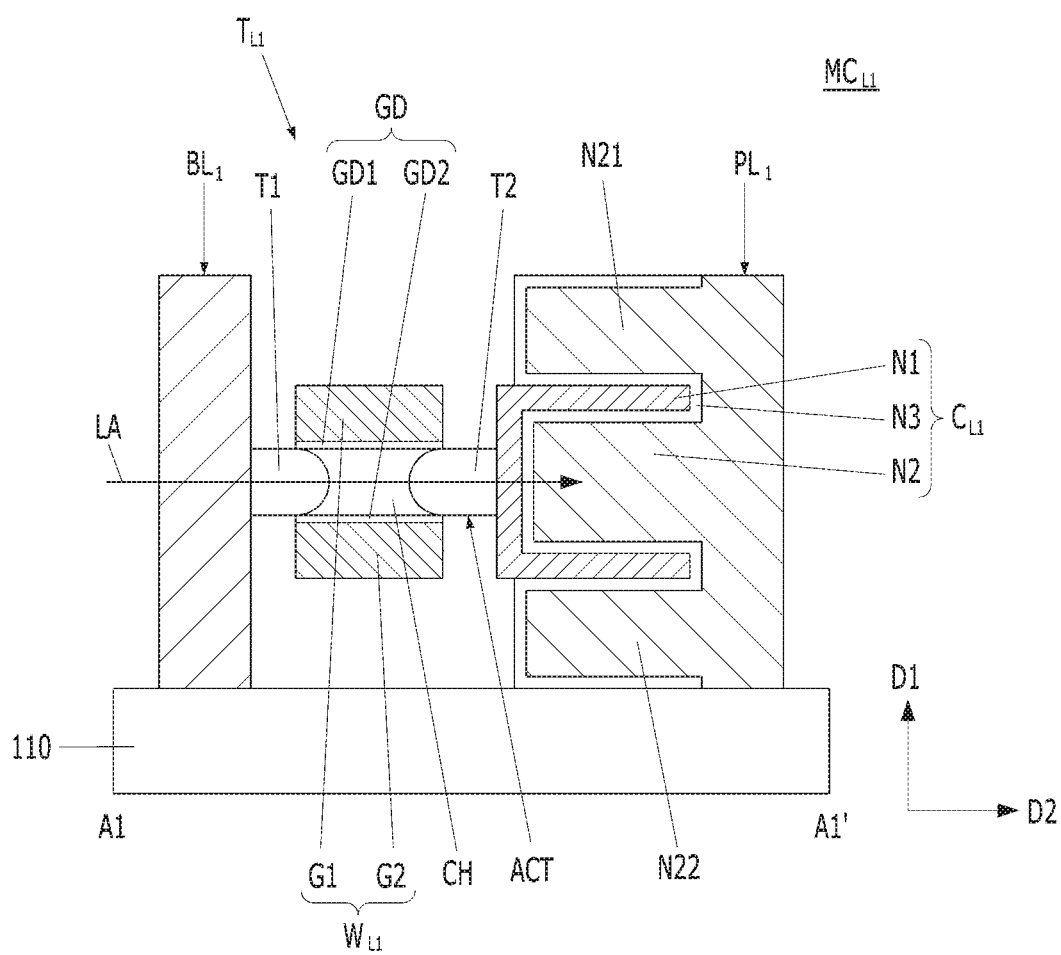
FIG. 8 is a cross-sectional view taken in a direction A1-A1' of FIG. 7.
Figure 9:
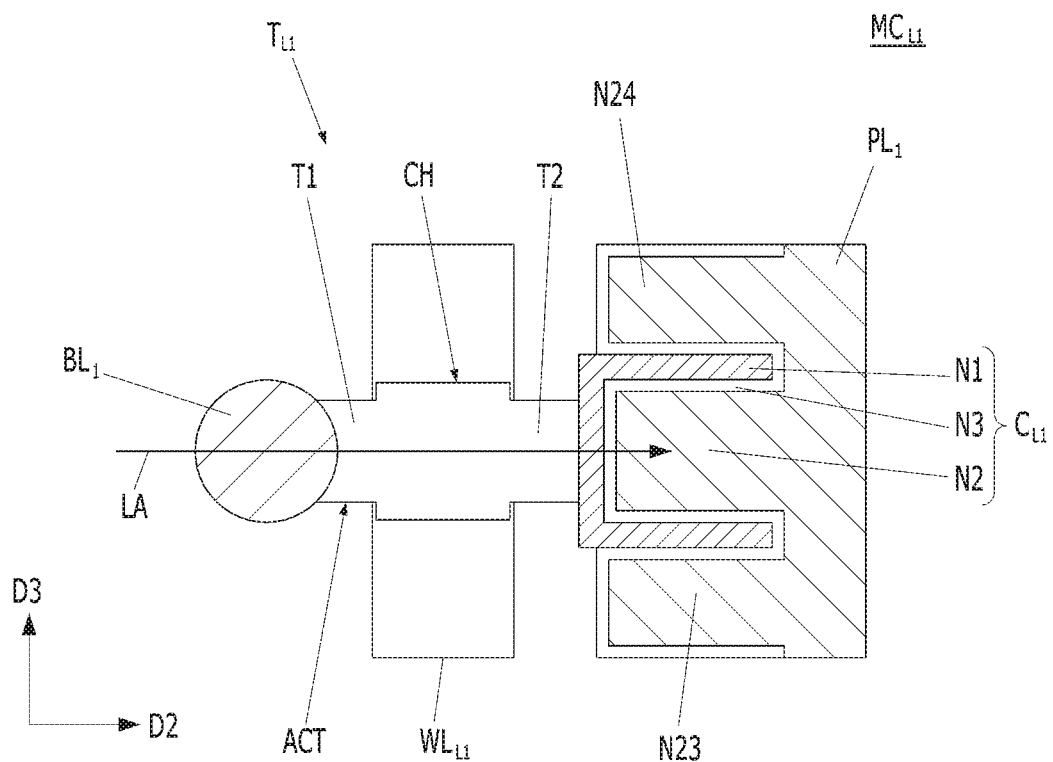
FIG. 9 is a plan view taken in a direction A2-A2' of FIG. 7.
Figure 10:
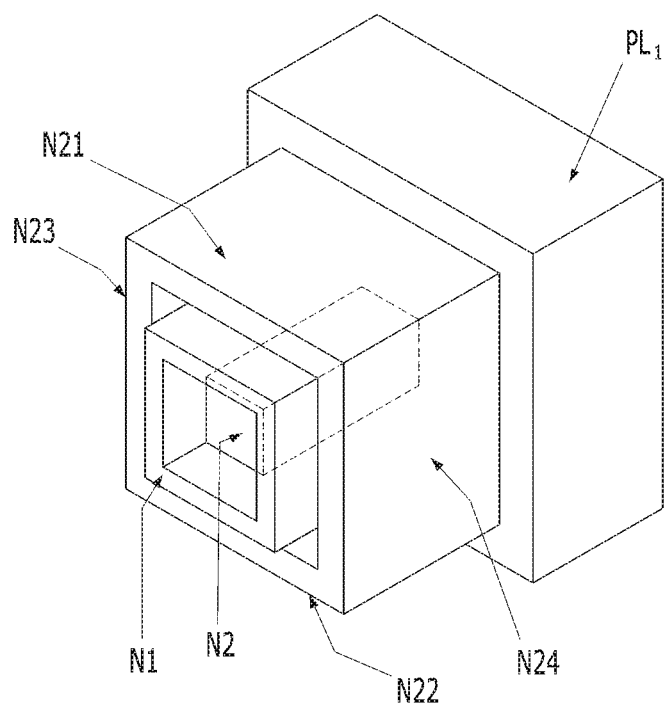
FIG. 10 is a detailed perspective view of a capacitor.

FIG. 7 is a perspective view showing details of a memory cell. FIG. 8 is a cross-sectional view taken in a direction A1-A1' of FIG. 7. FIG. 9 is a plan view taken in a direction A2-A2' of FIG. 7. FIG. 10 is a detailed perspective view of a capacitor. FIGS. 7 to 10 illustrate the memory cell $MC_{L1}$.

Referring to FIGS. 7 to 10, the memory cell $MC_{L1}$ may be positioned in a lateral arrangement (LA) in the second direction D2 which is parallel to the plane CP of the peripheral structure 110 between the bit line $BL_1$ and the plate line $PL_1$.

The memory cell $MC_{L1}$ may include a transistor $T_{L1}$ and a capacitor $C_{L1}$. The transistor $T_{L1}$ and the capacitor $C_{L1}$ may be positioned in a lateral arrangement (LA) extending in the second direction D2 which is parallel to the plane CP of the peripheral structure 110.

The transistor $T_{L1}$ may include an active layer ACT, a gate dielectric layer GD, and a word line $WL_{L1}$. The word line $WL_{L1}$ may include an upper word line G1 and a lower word line G2. That is, the word line $WL_{L1}$ may have the double word line structure in which the upper and lower word lines G1 and G2 are stacked with the active layer ACT therebetween.

The active layer ACT may include a first source/drain region T1 coupled to the bit line $BL_1$, a second source/drain region T2 coupled to the capacitor $C_{L1}$, and a channel CH positioned between the first source/drain region T1 and the second source/drain region T2. The active layer ACT may be laterally oriented in the second direction D2 between the bit line $BL_1$ and the capacitor $CL_1$. The active layer ACT may have the shape of an elongated flat plate. The first source/drain region T1, the channel CH, and the second source/drain region T2 may be positioned in a lateral arrangement LA which is oriented in the second direction D2 which is parallel to the plane CR The first source/drain region T1, the second source/drain region T2, and the channel CH may be formed in the active layer ACT. The active layer ACT may be formed to include any suitable semiconductor material. For example, the active layer ACT may include doped polysilicon, undoped polysilicon, or amorphous silicon. The first source/drain region T1 and the second source/drain region T2 may be doped with an N-type impurity or a P-type impurity. The first source/drain region T1 and the second source/drain region T2 may be doped with an impurity of the same conductivity type. The first source/drain region T1 and the second source/drain region T2 may include at least one impurity selected from a group including arsenic (As), phosphorus (P), boron (B), indium (In), and combinations thereof. In some embodiments of the present invention, the channel CH may be doped with a conductive impurity. Referring to FIG. 9, the width of the channel CH along the third direction D3 may be greater than the width of the first and second source/drain regions T1 and T2.

The upper word line G1 and the lower word line G2 may form a single pair. The upper word line G1 and the lower word line G2 may be vertically stacked while spaced apart from each other in the first direction D1 with the channel CH interposed therebetween, and may be oriented along the third direction D3. The upper word line G1 and the lower word line G2 may be parallel to the plane CP, and extend along the third direction D3 which is parallel to the second direction D2. The upper word line G1 and the lower word line G2 may have a shape of lines extending along the third direction D3. The pair of the upper word line G1 and the lower word line G2 may form a vertically stacked double gate. The upper word line G1 and the lower word line G2 may include a silicon-based material, a metal-based material, or a combination thereof. The upper word line G1 and the lower word line G2 may include polysilicon, titanium nitride, tungsten, aluminum, copper, tungsten silicide, titanium silicide, nickel silicide, cobalt silicide or a combination thereof.

The upper word line G1 and the lower word line G2 may be set to the same potential, and one end of the upper word line G1 and one end of the lower word line G2 may be electrically connected to each other at an end of an array of units of mats or blocks of a plurality of memory cells. In an embodiment, the upper word line G1 and the lower word line G2 of the memory cells $MC_{L1}$ may be connected to different nodes. The upper word line G1 may be connected to a node for applying a first voltage, and the lower word line G2 may be connected to another node applied with a second voltage. The first voltage and the second voltage are different from each other. For example, the upper word line G1 may be applied with a word line driving voltage, the lower word line G2 may be applied with a ground voltage. The upper word line G1 and the lower word line G2 may have the same width in the second direction D2 and the same length along the third direction D3. The upper word line G1 and the lower word line G2 may have the same thickness (dimension in the first direction D1). The upper word line G1, the lower word line G2, and the active layer ACT may have the same thickness or different thicknesses. Both side edges of the upper word line G1 and both side edges of the lower word line G2 may be aligned with each other. According to another embodiment of the present invention, both side edges of the upper word line G1 and both side edges of the lower word line G2 may not be aligned with each other. The upper word line G1 and the lower word line G2 may overlap with the channel CH of the active layer ACT in the first direction D1. The upper word line G1 and the lower word line G2 may partially cover the upper and lower portions of the active layer ACT. The upper word line and the lower word line G2 may be formed of a material which is different from that of the active layer ACT. The upper word line G1 and the lower word line G2 may be paired. The word line resistance may be lowered because a pair of word lines including the upper word line G1 and the lower word line G2 is formed. In addition, since a pair of the upper word line G1 and the lower word line G2 are formed, interference between the memory cells that are vertically adjacent to each other may be prevented. For example, the lower word line G2 of the memory cell $MC_{U1}$ may be provided between the upper word line of the memory cell $MC_{L1}$ and the upper word line G1 of the memory cell $MC_{U1}$. The lower word line G2 may be used to inhibit/prevent adjacent ones of the upper word lines G1 from being electrically coupled to each other.

The gate dielectric layer GD may be formed on the upper surface and the lower surface of the active layer ACT, individually. The gate dielectric layer GD may include a first dielectric portion GD1 and a second dielectric portion GD2. The first dielectric portion GD1 may be formed between the upper word line G1 and the channel CH, and the second dielectric portion GD2 may be formed between the lower word line G2 and the channel CH. The first dielectric portion GD1 may be discontinuous from the second dielectric portion GD2. The first dielectric portion GD1 and the second dielectric portion GD2 may have the same thickness and may be formed of the same material. The gate dielectric layer GD may include silicon oxide, silicon nitride, or a combination thereof. The gate dielectric layer GD may be formed by thermal oxidation of the active layer ACT. According to another embodiment of the present invention, the gate dielectric GD may include a high dielectric material, and the high dielectric material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_3$). According to another embodiment of the present invention, the gate dielectric layer GD may include a stack of silicon oxide and a high dielectric material, the silicon oxide may be in direct contact with the channel CH, and the high dielectric material may be in direct contact with the upper word line G1 and the lower word line G2.

The capacitor $C_{L1}$ may include a first node N1 coupled to the transistor $T_{L1}$, a second node N2 coupled to the plate line $PL_1$, and a dielectric material N3 disposed between the first node N1 and the second node N2. The dielectric material N3 may form a continuous layer between the first node N1 and the second node N2. The first node N1, the dielectric material N3, and the second node N2 may be positioned in a lateral arrangement which is parallel to the plane CP.

The first node N1 of the capacitor $C_{L1}$ may have a three-dimensional structure. The first node N1 of the three-dimensional structure may be a lateral three-dimensional structure which is parallel to the plane CP. As an example of the three-dimensional structure, the first node N1 of the capacitor $C_{L1}$ may have a cylindrical shape, a pillar shape, or a pylinder shape (i.e., a merged form of a pillar shape and a cylindrical shape). The first node N1 may include polysilicon, metal, noble metal, a metal nitride, a conductive metal oxide, a conductive noble metal oxide, a metal carbide, a metal silicide, or a combination thereof. For example, the first node N1 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride and tungsten (TiN/W), or a stack of tungsten nitride and tungsten (WN/W).

The second node N2 of the capacitor $C_{L1}$ may have a branch shape extending in the second direction D2 which is parallel to the plane CP from the plate line $PL_1$. The dielectric material N3 may have a shape surrounding the second node N2 having a form of branch, and the first node N1 may have a shape surrounding the second node N2 with the dielectric material N3 interposed therebetween. For example, the first node N1 having a cylindrical shape may be electrically connected to the second source/drain region T2 of the transistor $T_{L1}$, and the second node N2 may be positioned in the inside of the cylindrical shape of the first node N1, and the second node N2 may be electrically connected to the plate line $PL_1$.

Referring to FIG. 10, the second node N2 of the capacitor $C_{L1}$ may further include outer second nodes N21, N22, N23 and N24 coupled to the plate line $PL_1$. The outer second nodes N21, N22, N23 and N24 may be positioned outside the first node N1 with the dielectric material N3 interposed therebetween. The second node N2 may be abbreviated as an 'inner second node', and the inner second node N2 may be positioned inside the cylindrical shape of the first node N1.

The outer second nodes N21, N22, N23 and N24 may be positioned to surround the outer wall of the cylindrical shape of the first node N1. The outer second nodes N21, N22, N23 and N24 may be in continuum with each other.

The capacitor $C_{L1}$ may include a metal-insulator-metal (MIM) capacitor. The first node N1 and the second nodes N2, N21, N22, N23 and N24 may include a metal-based material, and the dielectric material N3 may include silicon oxide, silicon nitride, or a combination thereof. The dielectric material N3 may include a high dielectric (high-k) material having a higher dielectric constant than that of silicon oxide ($SiO_2$) which has a dielectric constant of approximately 3.9. The dielectric material N3 may include a high dielectric material having a dielectric constant of approximately 4 or higher. The high dielectric material may have a dielectric constant of approximately 20 or more. The high dielectric material may include hafnium oxide ($HfO_2$), zirconium oxide ($ZrO_2$), aluminum oxide ($Al_2O_3$), lanthanum oxide ($La_2O_3$), titanium oxide ($TiO_2$), tantalum oxide ($Ta_2O_5$), niobium oxide ($Nb_2O_5$), or strontium titanium oxide ($SrTiO_1$). According to another embodiment of the present invention, the dielectric material N3 may be a composite layer including two or more layers of the aforementioned high-dielectric materials.

The first node N1 and the second nodes N2, N21, N22, N23 and N24 may include a metal, a noble metal, a metal nitride, a conductive metal oxide, a conductive noble metal oxide, a metal carbide, a metal silicide, or a combination thereof. For example, the first node N1 and the second nodes N2, N21, N22, N23 and N24 may include titanium (Ti), titanium nitride (TiN), tantalum (Ta), tantalum nitride (TaN), tungsten (W), tungsten nitride (WN), ruthenium (Ru), ruthenium oxide ($RuO_2$), iridium (Ir), iridium oxide ($IrO_2$), platinum (Pt), molybdenum (Mo), molybdenum oxide (MoO), a stack of titanium nitride/tungsten (TiN/W), a stack of tungsten nitride/tungsten (WN/W). The first node N1 and the second nodes N2, N21 and N22 may include a combination of a metal-based material and a silicon-based material. For example, the second nodes N2, N21, N22, N23 and N24 may be a stack of titanium nitride/silicon germanium/tungsten nitride (TiN/SiGe/WN).

The dielectric material N3 may be formed of a zirconium-based oxide. The dielectric material N3 may have a stack structure including zirconium oxide ($ZrO_2$). The stack structure including zirconium oxide ($ZrO_2$) may include a ZA ($ZrO_2/Al_2O_3$) stack or a ZAZ ($ZrO_2/Al_2O_3/ZrO_2$) stack. The ZA stack may be a structure in which aluminum oxide ($Al_2O_3$) is stacked over zirconium oxide ($ZrO_2$), and zirconium oxide ($ZrO_2$) may contact the first node N1, while aluminum oxide ($Al_2O_3$) may contact the second node N2. The ZAZ stack may be a structure in which zirconium oxide ($ZrO_2$), aluminum oxide ($Al_2O_3$), and zirconium oxide ($ZrO_2$) are sequentially stacked. The ZA stack and the ZAZ stack may be referred to as a zirconium oxide-based layer. According to another embodiment of the present invention, the dielectric material N3 may be formed of a hafnium-based oxide. The dielectric material N3 may have a stack structure including hafnium oxide ($HfO_2$). The stack structure including hafnium oxide ($HfO_2$) may include an HA ($HfO_2/Al_2O_3$) stack or an HAH ($HfO_2/Al_2O_3/HfO_2$) stack. The HA stack may be a structure in which aluminum oxide ($Al_2O_3$) is stacked over hafnium oxide ($HfO_2$), and hafnium oxide ($HfO_2$) may contact the first node N1, and aluminum oxide ($Al_2O_3$) may contact the second node N2. The HAH stack may be a structure in which hafnium oxide ($HfO_2$), aluminum oxide ($Al_2O_3$), and hafnium oxide ($HfO_2$) are sequentially stacked. The HA stack and the HAH stack may be referred to as a hafnium oxide-based layer ($HfO_2$-based layer). In the ZA stack, the ZAZ stack, the HA stack, and the HAH stack, the aluminum oxide ($Al_2O_3$) may have a band gap energy which is larger than those of zirconium oxide ($ZrO_2$) and hafnium oxide ($HfO_2$). Aluminum oxide ($Al_2O_3$) may have a lower dielectric constant than zirconium oxide ($ZrO_2$) and hafnium oxide ($HfO_2$). Thus, the dielectric material N3 may include a stack of a high dielectric material and a high-band gap energy material whose band gap energy is greater than the high dielectric material. The dielectric material N3 may include silicon oxide ($SiO_2$) as another high-band gap energy material other than aluminum oxide ($Al_2O_3$). The dielectric material N3 may include a high-band gap energy material so that the leakage current may be suppressed. The high-band gap energy material may be extremely thin. The high-band gap energy material may be thinner than the high dielectric material.

According to another embodiment of the present invention, the dielectric material N3 may have a laminated structure in which a high dielectric material and a high-band gap material are alternately stacked. For example, the dielectric material N3 may have ZAZA ($ZrO_2/Al_2O_3/ZrO_2/Al_2O_3$), ZAZAZ ($ZrO_2/Al_2O_3/ZrO_2/Al_2O_3/ZrO_2$), HAHA ($HfO_2/Al_2O_3/HfO_2/Al_2O_3$) or HAHAH ($HfO_2/Al_2O_3/HfO_2/Al_2O_3/HfO_2$). In the laminated structure, the aluminum oxide ($Al_2O_3$) may be extremely thin.

According to another embodiment of the present invention, the dielectric material N3 may include a stack structure, a laminated structure or an inter-mixing structure including zirconium oxide, hafnium oxide, and aluminum oxide.

According to another embodiment of the present invention, an interface controlling layer may be further formed to improve the leakage current between the first node N1 and the dielectric material N3. The interface controlling layer may include titanium oxide ($TiO_2$). The interface controlling layer may be formed between the second node N2 and the dielectric material N3.

The bit line $BL_1$ and the plate line $PL_1$ may include a silicon-based material, a metal-base material or a combination thereof. The bit line $BL_1$ may include polysilicon, titanium nitride, tungsten, or a combination thereof. For example, the bit line $BL_1$ may include polysilicon doped with an N-type impurity or titanium nitride (TiN). The bit line $BL_1$ may include a stack of titanium nitride and tungsten (TiN/W). An ohmic contact such as a metal silicide may be further formed between the bit line $BL_1$ and the first source/drain region T1 of the transistor $T_{L1}$. The plate line $PL_1$ may be formed of the same material as that of the second nodes N2, N21, N22, N23 and N24. The plate line $PL_1$ and the second nodes N2, N21, N22, N23 and N24 may be formed simultaneously.

The bit line $BL_1$ may have a form of a pillar vertically extending from the plane CP in the first direction D1. A cross-section of the bit line $BL_1$ taken in the second direction D2 may be circle-shaped or oval-shaped. The pillar-shaped bit line $BL_1$ may have a low resistance.

The plate line $PL_1$ may be a linear shape vertically extending from the plane CP in the first direction D1. The cross-sections of the plate line $PL_1$ in the first, second direction, and third directions D1, D2, and D3 may be rectangles of different areas. The plate line $PL_1$ may have a width (dimension in the second direction D2) that is smaller than its length (dimension in the third direction D3) and also smaller than its height (dimension in the first direction D1). More specifically, the width (dimension in the second direction D2) of the plate line $PL_1$ may be the same as the width (dimension in the second direction D2) of the word line $W_{L1}$ as shown in FIG. 7. The height (dimension in the first direction D1) of the plate line $PL_1$ may be such that the top surface of the plate line $PL_1$ is positioned higher than a top surface of a node N1 of a capacitor (e.g., $C_{U2}$) of a top memory cell (e.g., $MC_{U2}$) of the upper memory cell array $MCA_U$. The length (dimension in the third direction D3) of the plate line $PL_1$ may be such that the plate line may be coextensive in the third direction with the word lines.

According to the above description, the upper word line G1 and the lower word line G2 may be formed to be laterally spaced apart from the bit line $BL_1$ and the plate line $PL_1$.

Accordingly, the parasitic capacitance between the word line $WL_{L1}$ and the capacitor $C_{L1}$ may be decreased, and the parasitic capacitance between the word line $WL_{L1}$ and the bit line $BL_1$ may be reduced.

The method of forming the memory cell $MC_{L1}$ of FIGS. 7 to 10 may include a process of forming the transistor $T_{L1}$, a process of forming the bit line $BL_1$, a process of forming the capacitor $C_{L1}$, and a process of forming the plate line $PL_1$.

A process of forming the transistor $T_{L1}$ will now be described. An active layer ACT may be formed to be vertically (i.e., in the first direction D1) spaced apart from the plane CP of a top surface of the peripheral structure 110, and gate dielectric layers GD1 and GD2 may be formed on the upper and lower surfaces of the active layer ACT. Subsequently, the upper word line G1 and the lower word line G2 may be formed over the gate dielectric layers GD1 and GD2, respectively. Subsequently, the first source/drain region T1 and the second source/drain region T2 may be formed through ion implantation of an impurity into the active layer ACT.

The bit line $BL_1$ may be formed to be vertically oriented from the plane CP of the peripheral structure 110. The bit line $BL_1$ may be formed to be coupled to the first source/drain region T1.

The process of forming the capacitor Cu will now be described. First, a first node N1 may be formed to be coupled to the second source/drain region 12. Subsequently, a dielectric material N3 may be formed over the first node N1. Subsequently, a second node N2 may be formed over the dielectric material N3. A plate line $PL_1$ may be formed while the second node N2 is formed. The plate line $PL_2$ may be vertically oriented from the plane CP of the peripheral structure 110.

Figure 11A:
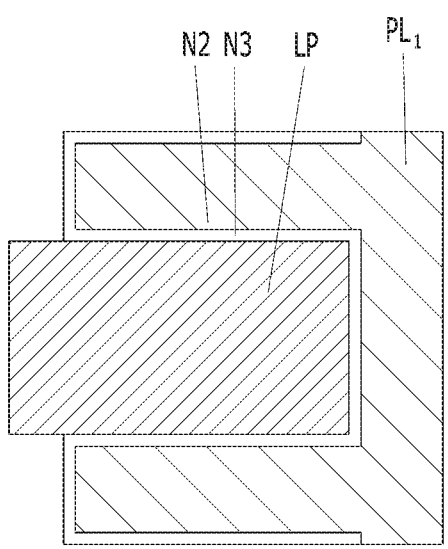
FIGS. 11A to 11C are views illustrating a first node of a capacitor having a three-dimensional structure in accordance with another embodiment of the present invention.
Figure 11B:
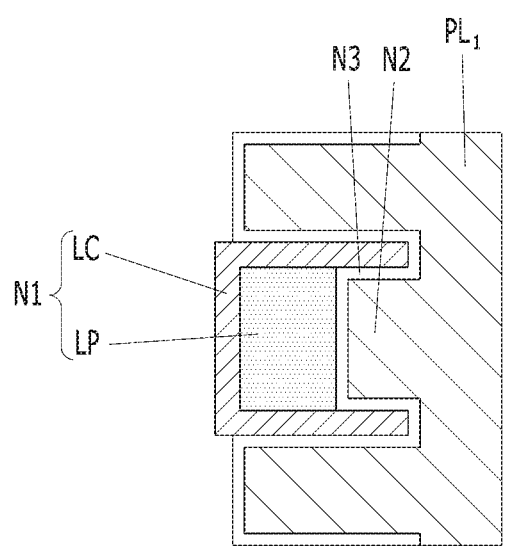
Figure 11C:
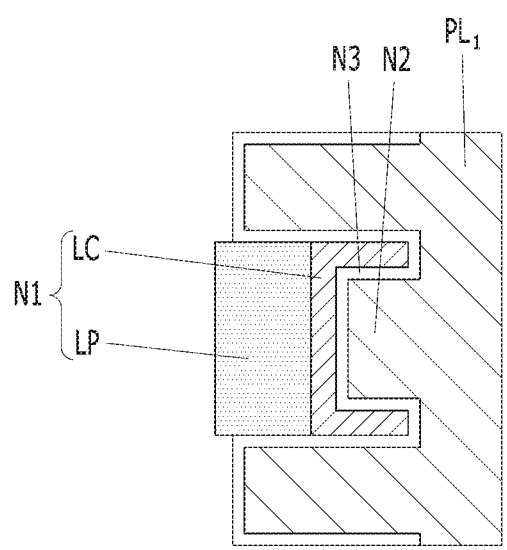

FIGS. 11A to 11C are views illustrating a first node of a capacitor having a three-dimensional structure in accordance with another embodiment of the present invention. FIG. 11A shows a pillar-shaped first node LP, and FIGS. 1113 and 11C show a first node N1 having a form of a pylinder, i.e., a combination of a pillar and a cylinder structure.

Referring to FIG. 11A, the first node N1 may be a lateral pillar LP. A lateral pillar LP may include a metal-based material, a silicon-based material, or a combination thereof. For example, the lateral pillar LP may be formed of titanium nitride alone or may be formed of a stack of titanium nitride and polysilicon.

Referring to FIGS. 11B and 11C, the first node N1 having the form of a pylinder may include a lateral cylinder LC and a lateral pillar LP that are parallel to the plane CP. Referring to FIG. 11B, the lateral pillar LP may be positioned in the inside of the lateral cylinder LC. The lateral length of the lateral cylinder LC may be longer than the lateral length of the lateral pillar LP. For example, the inlet of the lateral cylinder LC may not be filled with the lateral pillar LP. Referring to FIG. 11C, the lateral cylinder LC may be formed in a lateral arrangement over the lateral pillar LP.

Referring to FIG. 11B, the lateral cylinder LC and the lateral pillar LP may be of the same material or different materials. The lateral cylinder LC and the lateral pillar LP may include a metal-based material, a silicon-based material, or a combination thereof. For example, the lateral cylinders LC may be titanium nitride, and the lateral pillar LP may be polysilicon.

Referring to FIG. 11C, the lateral cylinder LC and the lateral pillar LP may be of the same material or different materials. The lateral cylinder LC and the lateral pillar LP may include a metal-based material, a silicon-based material, or a combination thereof. For example, the lateral cylinder LC and the lateral pillar LP may be of titanium nitride. In addition, the lateral cylinder LC may be of titanium nitride and the lateral pillar LP may be of polysilicon.

Figure 12A:
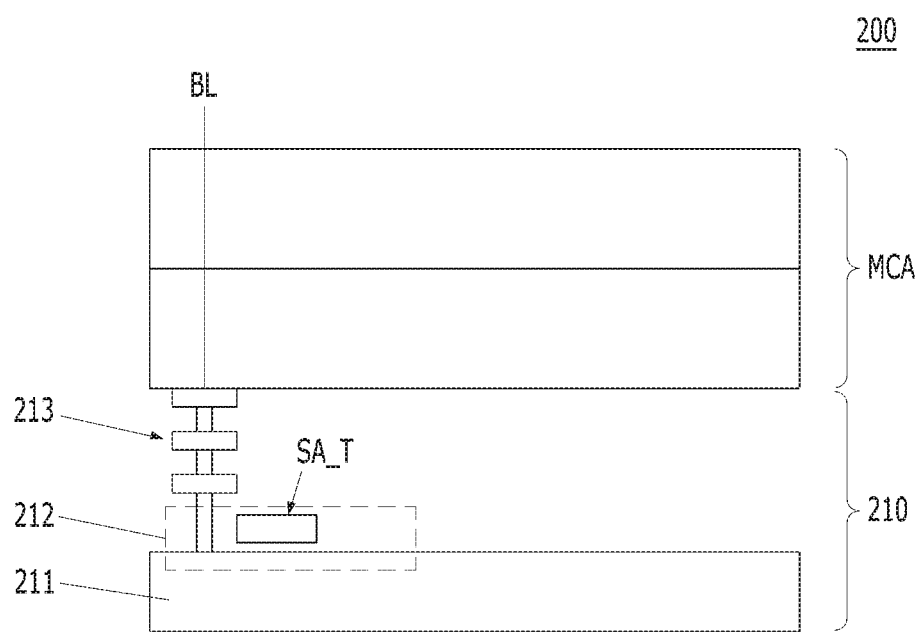
FIGS. 12A and 12B are views illustrating a memory device in accordance with another embodiment of the present invention.
Figure 12B:
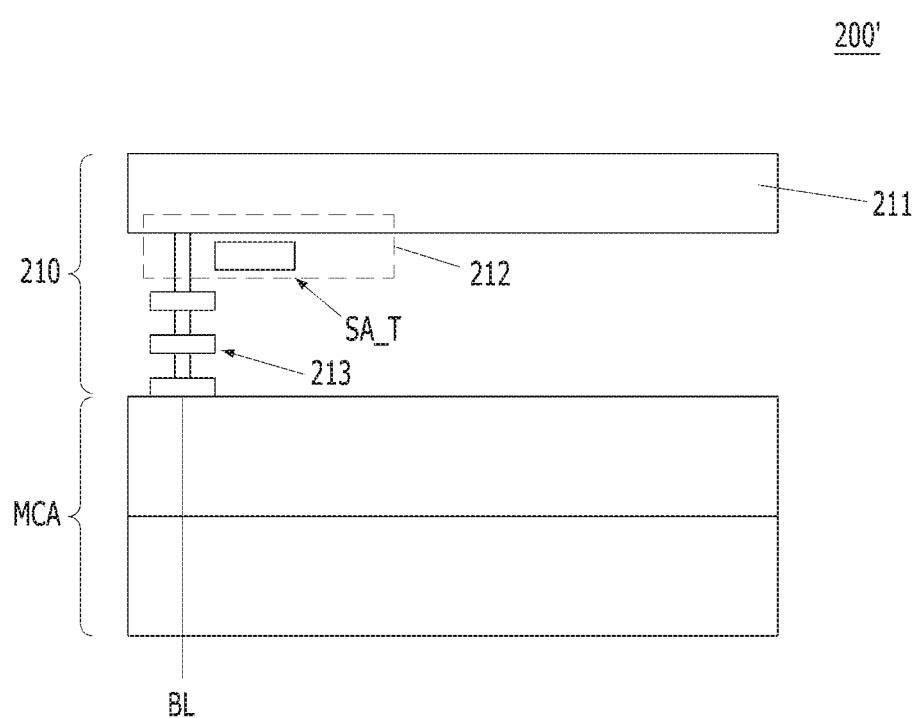

FIGS. 12A and 12B are views illustrating a memory device 200 and 200' in accordance with another embodiment of the present invention.

Referring to FIGS. 12A and 12B, the memory device 200 and 200' may include a peripheral circuit portion 210 and a memory cell array stack MCA. The memory cell array stack MCA may be the same as the memory cell array stack MCA of FIG. 1. The memory cell array stack MCA may include DRAM memory cell array.

Referring to FIG. 12A, the memory cell array stack MCA may be positioned over the peripheral circuit portion 210. The peripheral circuit portion 210 may correspond to the peripheral structure 110 of FIG. 1. Accordingly, the memory device 200 may have a PUC (Peripheral Under Cell) structure. The memory cell array stack MCA may be positioned over the semiconductor substrate 211 of the peripheral circuit portion 210.

Referring to FIG. 12B, the memory cell array stack MCA may be positioned under the peripheral circuit portion 210. The peripheral circuit portion 210 may correspond to the peripheral structure 110 of FIG. 1. For example, in FIG. 1, the peripheral structure 110 may be stacked above the memory cell array stack MCA. Thus, the memory device 200' may have a CUP (Cell under Peripheral) structure. The memory cell array stack MCA may be positioned under the semiconductor substrate 211 of the peripheral circuit portion 210.

The peripheral circuit portion 210 may refer to a circuit for driving and controlling the memory cell array stack MCA during a driving operation (including a read or write operation) to a memory. The peripheral circuit portion 210 may include an N-channel transistor, a P-channel transistor, a CMOS circuit, or a combination thereof. The peripheral circuit portion 210 may include an address decoder circuit, a read circuit, and a write circuit. The peripheral circuit portion 210 may include at least one circuit selected from sense amplifiers and sub-word line drivers. In an embodiment, the peripheral circuit portion 210 may have a structure including a semiconductor substrate 211 and a sense amplifier 212 arranged on the surfaces of the semiconductor substrate 211. The sense amplifier 212 may include a transistor SA_T using the semiconductor substrate 211 as a channel. The transistor SA_T may include a planar channel transistor whose channel is parallel to the surface of the semiconductor substrate 211. The transistor structure in the sense amplifier 211 may include a recess channel transistor, a buried gate transistor, and a fin channel transistor (FinFET) in addition to the planar channel transistor.

The bit lines BL of the memory cell array stack MCA may be electrically connected to the transistor SA_T of the sense amplifier 211. The bit lines BL and the transistor SA_T may be coupled to each other through a multi-level metal line MLM 213. The multi-level metal line MLM 213 may be formed by a Damascene process. It is understood that transistor SA_T is described as an example of a plurality of transistors which may be included in the peripheral circuit portion 210.

Although not illustrated, according to another embodiment of the present invention, the memory device 200 and 200' may include a first semiconductor substrate and a second semiconductor substrate bonded to the first semiconductor substrate. The memory cell array stack MCA may be formed over the first semiconductor substrate, and the peripheral circuit portion 210 may be formed over the second semiconductor substrate. Each of the first semiconductor substrate and the second semiconductor substrate may include conductive bonding pads, and the first semiconductor substrate and the second semiconductor substrate may be bonded to each other through the conductive bonding pads. Thus, the memory cell array stack MCA and the peripheral circuit portion 210 may be electrically connected to each other.

According to embodiments of the present invention, it is possible to increase cell density and to reduce parasitic capacitance by vertically stacking memory cells from a plane of a peripheral structure so as to form a three-dimensional structure.

According to embodiments of the present invention, interference between the vertically stacked memory cells may be prevented because a transistor of a memory cell includes double word lines stacked with an active layer therebetween.

According to embodiments of the present invention, since bit lines are formed as vertically oriented from a plane of a peripheral structure, bit line resistance may be reduced.

According to embodiments of the present invention, a memory device that is highly integrated within a limited area may be realized by vertically stacking memory cells in the upper or lower portion of a peripheral circuit portion.

While the present invention has been described with respect to specific embodiments, it will be apparent to those skilled in the art that various changes and modifications may be made without departing from the spirit and scope of the invention as defined in the following claims.

What is claimed is:

1. A memory device, comprising:
   a substrate;
   a bit line which is vertically oriented from the substrate;
   a plate line which is spaced apart from the bit line and vertically oriented from the substrate; and
   a memory cell including a transistor and a capacitor that are positioned in a lateral arrangement between the bit line and the plate line,
   wherein the transistor includes:
   an active layer which is laterally oriented to be parallel to the substrate between the bit line and the capacitor; and
   a pair of word lines oriented to intersect with the active layer,
   wherein the pair of word lines comprises:
   a line-shaped lower word line disposed over a lower surface of the active layer; and
   a line-shaped upper word line disposed over an upper surface of the active layer.

2. The memory device of claim 1, wherein the active layer of the transistor includes:
   a first source/drain region coupled to the bit line;
   a second source/drain region coupled to the capacitor; and
   a channel between the first source/drain region and the second source/drain region, and
   the first source/drain region, the channel, and the second source/drain region are positioned in a lateral arrangement between the bit line and the capacitor.

3. The memory device of claim 2, wherein the line-shaped lower word line and the line-shaped upper word line are vertically stacked with the channel of the transistor therebetween.

4. The memory device of claim 2, wherein the transistor further includes:
   a first gate dielectric layer is formed between the line-shaped upper word line and the channel; and
   a second gate dielectric layer is formed between the line-shaped lower word line and the channel.

5. The memory device of claim 1, wherein the line-shaped lower word line and the line-shaped upper word line are applied with different voltages.

6. The memory device of claim 1, wherein the capacitor includes:
   a first node coupled to the transistor;
   a second node coupled to the plate line; and
   a dielectric material between the first node and the second node,
   wherein the first node, the dielectric material, and the second node are positioned in a lateral arrangement between the transistor and the plate line.

7. The memory device of claim 6, wherein the first node of the capacitor has a three-dimensional structure, and the three-dimensional structure is a laterally oriented to be parallel to the substrate.

8. The memory device of claim 6, wherein the first node of the capacitor has a lateral cylindrical shape, a lateral pillar shape, or a pylinder shape which is a merged form of the lateral cylindrical shape and the lateral pillar shape.

9. The memory device of claim 6, wherein the first node of the capacitor has a lateral cylindrical shape, and
   the second node of the capacitor includes:
   an inner second node which is laterally oriented from the plate line and extending into the cylindrical shape of the first node; and
   a plurality of outer second nodes which are laterally oriented from the plate line and surround an outside of the cylindrical shape of the first node.

10. The memory device of claim 1, wherein the line-shaped lower word line and the line-shaped upper word line are laterally spaced apart from the bit line, the plate line, and the capacitor.

11. The memory device of claim 1, wherein the substrate includes a peripheral circuit portion for controlling the memory cell, and the peripheral circuit portion is formed under the memory cell.

12. The memory device of claim 1, wherein the substrate includes a peripheral circuit portion for controlling the memory cell, and the peripheral circuit portion is formed over the memory cell.

13. The memory device of claim 1, further comprising:
    a neighboring bit line which is laterally spaced apart from the bit line and vertically oriented from the substrate; and
    a neighboring memory cell which is stacked in a direction perpendicular to the substrate between the neighboring bit line and the plate line,
    wherein the memory cell and the neighboring memory cell are laterally arranged in a mirror-like structure sharing the plate line.

14. The memory device of claim 1, further comprising:
    a neighboring plate line which is laterally spaced apart from the plate line and vertically oriented from the substrate; and
    a neighboring memory cell which is stacked in a direction perpendicular to the substrate between the neighboring plate line and the bit line,
    wherein the memory cell and the neighboring memory cell are laterally arranged in a mirror-like structure sharing the bit line.

15. The memory device of claim 1, further comprising:

a neighboring bit line which is laterally spaced apart from the bit line and vertically oriented from the substrate; and a neighboring memory cell which is stacked in a direction perpendicular to the substrate between the neighboring bit line and the plate line, wherein the neighboring memory cell includes:

a neighboring transistor including a neighboring active layer which is laterally oriented to be parallel to the substrate between the neighboring bit line and the plate line; and a neighboring capacitor which is laterally oriented to be parallel to the substrate between the neighboring transistor and the plate line, wherein the line-shaped lower word line is shared by the neighboring transistor and the transistor, and wherein the line-shaped upper word line is shared by the neighboring transistor and the transistor.

16. The memory device of claim 1, wherein the line-shaped upper word line and the line-shaped lower word line are set to the same potential, and wherein the line-shaped upper word line and the line-shaped lower word line are electrically connected to each other.

17. A memory device, comprising:

a substrate;

a bit line extending in a first direction from the substrate, the first direction perpendicular to a surface of the substrate;

an active layer extending in a second direction from the bit line, the second direction parallel to the surface of the substrate, the active layer having a lower surface and an upper surface which are opposite to each other in the first direction;

a capacitor electrically connected to the active layer; and a double word line structure extending in a third direction across the active layer, the third direction being parallel to the surface of the substrate and intersecting the second direction;

wherein the double word line structure comprising:

a lower word line disposed over the lower surface of the active layer; and an upper word line disposed over the upper surface of the active layer, wherein the lower and upper word lines are set to the same potential and are electrically connected to each other.

18. The memory device of claim 17, wherein the capacitor includes:

a first node coupled to the active layer;

a second node on the first node; and a dielectric material between the first node and the second node.

19. The memory device of claim 18, wherein the first node of the capacitor has a lateral cylindrical shape, and the second node of the capacitor includes:

an inner second node extending into the cylindrical shape of the first node; and a plurality of outer second nodes surrounding an outside of the cylindrical shape of the first node.

20. The memory device of claim 17, further comprising:

a peripheral circuit portion; and a memory cell array including a plurality of memory cells, wherein each of the memory cell including the bit line, the capacitor, the double word line structure, and the active layer, and wherein the memory cell array and the peripheral circuit portion are stacked in the first direction.

* * * * *